(12) United States Patent
Lee

(10) Patent No.: US 12,557,580 B2
(45) Date of Patent: Feb. 17, 2026

(54) APPARATUS AND METHOD FOR SUPPLYING PROCESSING LIQUID

(71) Applicant: SEMES CO., LTD., Cheonan-si (KR)

(72) Inventor: Mu Hyeon Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 561 days.

(21) Appl. No.: 17/520,481

(22) Filed: Nov. 5, 2021

(65) Prior Publication Data
US 2022/0199432 A1    Jun. 23, 2022

(30) Foreign Application Priority Data

Dec. 18, 2020 (KR) .................. 10-2020-0178505

(51) Int. Cl.
*H01L 21/67* (2006.01)
*H01L 21/02* (2006.01)

(52) U.S. Cl.
CPC .... *H01L 21/67057* (2013.01); *H01L 21/0206* (2013.01); *H01L 21/6708* (2013.01)

(58) Field of Classification Search
None
See application file for complete search history.

(56) References Cited

U.S. PATENT DOCUMENTS

| | | |
|---|---|---|
| 10,083,840 B2 | 9/2018 | Lee et al. |
| 10,319,602 B2 | 6/2019 | Kobayashi et al. |
| 10,580,668 B2 | 3/2020 | Hinode et al. |
| 2009/0229641 A1* | 9/2009 | Yoshida ............... B08B 3/14 134/107 |
| 2014/0290859 A1 | 10/2014 | Kobayashi et al. |
| 2015/0262737 A1 | 9/2015 | Hinode et al. |
| 2018/0096856 A1* | 4/2018 | Kim ............... H01L 21/67253 |
| 2020/0381245 A1 | 12/2020 | Takeguchi et al. |
| 2021/0118704 A1* | 4/2021 | Aratake ........... H01L 21/67253 |

FOREIGN PATENT DOCUMENTS

| | | |
|---|---|---|
| JP | 2003-338486 | 11/2003 |
| JP | 2010-232520 | 10/2010 |
| JP | 2013-207207 | 10/2013 |
| JP | 2014-209581 | 11/2014 |
| JP | 2015-195306 | 11/2015 |

(Continued)

OTHER PUBLICATIONS

JP H10118899 A, Method and Device for Recovering and Reusing Abrasive machine translation, Hayashi (Year: 1998).*

(Continued)

*Primary Examiner* — Cristi J Tate-Sims

(57) ABSTRACT

A method for supplying processing liquid is configured to adjust the supply amount of silica by a processing liquid supply unit in order to improve a selectivity ratio in a substrate treatment process through the processing liquid, to mix processing liquid substances, to adjust the concentration and temperature of the processing liquid on the basis of a substrate processing condition to supply the processing liquid to a substrate processing apparatus, to recover the processing liquid through a processing liquid recycling unit spatially separated from a processing liquid supply unit and to adjust the concentration of moisture and temperature of the processing liquid, and to supply the recycled processing liquid.

15 Claims, 18 Drawing Sheets

(56) References Cited

FOREIGN PATENT DOCUMENTS

| | | |
|---|---|---|
| JP | 2020-194842 | 12/2020 |
| KR | 100801656 | 1/2008 |
| KR | 10-2008-0011910 | 2/2008 |
| KR | 1020110080270 | 7/2011 |
| KR | 10-1395220 | 2/2012 |
| KR | 1020150108329 | 9/2015 |
| KR | 10-2016-0140197 | 12/2016 |
| KR | 10-2019-0142305 | 12/2019 |
| TW | I539516 | 8/2015 |
| WO | 2020-105403 | 11/2019 |

OTHER PUBLICATIONS

Office Action from the Japan Patent Office dated Oct. 11, 2022.
Office Action from the Taiwan Intellectual Property Office dated Aug. 31, 2022.
Office Action from the Korean Intellectual Property Office dated Jul. 18, 2023.

\* cited by examiner

APPARATUS AND METHOD FOR SUPPLYING PROCESSING LIQUID

CROSS REFERENCE TO RELATED APPLICATION

The present application claims priority to Korean Patent Application No. 10-2020-0178505, filed on Dec. 18, 2020, the entire contents of which is incorporated by reference herein for all purposes.

BACKGROUND OF THE INVENTION

Field of the Invention

The present disclosure relates to an apparatus and method for supplying processing liquid. More particularly, the present disclosure relates to a method for supplying processing liquid, which is configured to adjust the supply amount of silica by a processing liquid supply unit in order to improve a selectivity ratio in a substrate treatment process through the processing liquid, to mix processing liquid substances, to adjust the concentration and temperature of the processing liquid on the basis of a substrate processing condition to supply the processing liquid to a substrate processing apparatus, to recover the processing liquid through a processing liquid recycling unit spatially separated from a processing liquid supply unit and to adjust the concentration of moisture and temperature of the processing liquid, and to supply the recycled processing liquid.

Description of the Related Art

In general, various types of processing liquids are used in manufacturing processes of semiconductor devices and display panels. The processing liquids are adjusted to be suitable for process conditions such as concentration, temperature and flow rate through a processing liquid supply device, and are supplied to a substrate processing apparatus that processes the substrate. The processing liquid supply device supplies a single type of processing liquid or a mixture of different processing liquids to the substrate processing apparatus.

For example, in the cleaning or etching process, a processing liquid such as a phosphoric acid solution is supplied as an etchant to a surface of a substrate on which a silicon nitride film and a silicon oxide film are formed, so that the silicon nitride film is selectively removed.

A selectivity ratio between the removal amount of the silicon nitride film and the removal amount of the silicon oxide film and an etching rate, which is the amount of silicon nitride film removed per unit time, are highest when the temperature of the processing liquid such as phosphoric acid solution supplied on the substrate is near the boiling point. However, in a single-wafer type substrate processing apparatus, even when the temperature of the processing liquid such as phosphoric acid solution is adjusted to a point near the boiling point in a tank, the temperature of the processing liquid is lowered when the processing liquid is supplied to the substrate for actual processing. Therefore, it is difficult to supply the processing liquid located near the boiling point with a proper level to the substrate treatment process.

When the phosphoric acid solution is used to selectively etch the silicon nitride film and the silicon oxide film, silica contained in the phosphoric acid solution is an important factor in the etching selectivity ratio.

For example, the concentration of silica is low in the processing liquid of phosphoric acid solution, the etching speed of the silicon oxide film increases, and the etching selectivity ratio with respect to the silicon nitride film is lowered. On the other hand, when the concentration of silica is high, selective etching may not be performed properly or a filter may become clogged.

Therefore, when the etching process is performed using the processing liquid such as phosphoric acid solution, it is important to adjust the concentration of silica contained in the processing liquid within an appropriate range in response to a purpose of processing.

DOCUMENTS OF RELATED ART (Patent Document 1) Korean Patent Application Publication No. 10-2011-0080270
(Patent Document 2) Korean Patent Application Publication No. 10-2015-0108329
(Patent Document 3) Korean Patent No. 10-0801656

SUMMARY OF THE INVENTION

Accordingly, the present disclosure has been made keeping in mind the above problems occurring in the related art, and the present disclosure is intended to provide a method capable of improving the selectivity ratio of a substrate treatment process and of maintaining properties of substrate treatment uniformly.

Another objective of the present disclosure is provide a method capable of maintaining the contained amount of silica to a proper level and of maintaining the concentration and temperature of processing liquid of phosphoric acid solution when the phosphoric acid solution containing silica are supplied, recovered, and recycled during a process using the processing liquid including the phosphoric acid solution.

The problem to be solved is not limited thereto, and other problems not mentioned will be clearly understood by those skilled in the art from the following description.

In order to achieve the above objective, according to one aspect of the present disclosure, there is provided a processing liquid supply device, the processing liquid supply device including: a processing liquid supply unit including a main supply part configured to supply processing liquid to a substrate processing apparatus, and an adjustment supply part configured to adjust the processing liquid in response to a substrate processing condition and to supply the processing liquid to the main supply part; a processing liquid recycling unit including a recovery part configured to recover the processing liquid from the substrate processing apparatus, and a processing liquid recycling part configured to be supplied with the processing liquid recovered from the recovery part and to adjust the processing liquid in response to a recycling condition to supply the processing liquid to the adjustment supply part; and a control unit configured to control supply, adjustment, recovery, recycling, or disposal for the processing liquid, performed by the processing liquid supply unit and the processing liquid recycling unit.

The processing liquid supply unit may further include a silica supply means configured to measure a supply amount of silica and to supply silica in response to the substrate processing condition, and the adjustment supply part may include: an adjustment tank configured to adjust the processing liquid containing silica, and to supply the adjusted processing liquid to the main supply part; and an adjustment circulation line configured to circulate the processing liquid in the adjustment tank, to measure concentration of the processing liquid, and to adjust temperature of the processing liquid, and the control unit may be configured to control supply or heating temperature of phosphoric acid and deionized water (DIW) in response to a measuring result of concentration of the phosphoric acid in the processing liquid in the adjustment circulation line to adjust the concentration of the phosphoric acid.

The processing liquid supply unit may further include a mixing means configured to supply the phosphoric acid solution, in which phosphoric acid and DIW may be mixed together, to the adjustment tank in response to the substrate processing condition, and the control unit may be configured to adjust the concentration of the phosphoric acid by supplying the phosphoric acid solution through the mixing means in response to the measuring result of the concentration of the phosphoric acid in the processing liquid in the adjustment circulation line.

The adjustment supply part may include a first adjustment supply part and a second adjustment supply part which may be configured to supply the processing liquid to the main supply part.

The control unit may be configured to control any one of the first adjustment supply part and the second adjustment supply part to adjust the processing liquid, and to control a remaining one of the first and second adjustment supply parts to supply the processing liquid to the main supply part or to be supplied with the processing liquid from the processing liquid recycling part.

The control unit may be configured to control the first adjustment supply part to be supplied with the recycled processing liquid from the processing liquid recycling part, and to control the second adjustment supply part to be supplied with a new processing liquid substance.

The main supply part may include: a main supply tank configured to supply the processing liquid to the substrate processing apparatus; and a sampling line configured to sample and measure the processing liquid supplied from the main supply tank, and the control unit may be configured to control supplying of silica in the adjustment supply part in response to a measuring result of concentration of silica in the sampled processing liquid to adjust the concentration of silica, or to drain the processing liquid recovered by the recovery part to an outside of the recovery part and dispose the processing liquid.

The processing liquid recycling part may include: a recovery tank configured to adjust concentration of moisture in the processing liquid supplied from the recovery part and to supply the processing liquid to the processing liquid supply unit; and a recycling circulation line configured to circulate and filter the processing liquid in a sub recovery tank and to measure concentration of the processing liquid and adjust the temperature thereof, and the control unit may be configured to control supplying or heating temperature of DIW to adjust the concentration of moisture in response to a measuring result of the concentration of moisture in the processing liquid in the recycling circulation line.

The recovery part may include: a recovery tank configured to recover the processing liquid from the substrate processing apparatus; a plurality of branch tubes arranged between an outlet tube of the recovery tank and an inlet tube of the processing liquid recycling part; and a main filter arranged in each of the branch tubes and configured to filter the processing liquid.

The recovery part may include: a recovery tank configured to recover the processing liquid from the substrate processing apparatus; and a drain valve configured to drain the processing liquid in the recovery tank to an outside of the drain valve, and the control unit may be configured to control the recovered processing liquid to be drained to the outside of the recovery part and to be discarded on the basis of a measuring result of the concentration of silica in the processing liquid supplied to the substrate processing apparatus or the number of time the processing liquid is recovered.

The processing liquid recycling part may include a first processing liquid recycling part and a second processing liquid recycling part, which may be configured to be supplied with the processing liquid from the recovery part and to supply the adjusted processing liquid to the adjustment supply part.

The control unit may be configured to control any one of the first processing liquid recycling part and the second processing liquid recycling part to recycle the processing liquid, and to control a remaining one of the first and second processing liquid recycling parts to be supplied with the processing liquid from the recovery part or to supply the recycled processing liquid to the adjustment supply part.

The processing liquid supply unit may be arranged in a space coincident with the substrate processing apparatus, and the processing liquid recycling unit may be arranged in a separate space from the processing liquid supply unit.

In order to achieve the above objective, according to another aspect of the present disclosure, there is provided a processing liquid supply method, the processing liquid supply method including: supplying processing liquid, wherein the processing liquid supplied to an adjustment supply part may be self-circulated through an adjustment circulation line, and concentration and temperature of the processing liquid may be adjusted, and the processing liquid adjusted on the basis of a substrate processing condition may be supplied to a main supply part; recovering the processing liquid, wherein the used processing liquid may be recovered from a substrate processing apparatus to a recovery part; and recycling the processing liquid, wherein the processing liquid supplied from the recovery part to a processing liquid recycling part may be self-circulated through a recycling circulation line and be filtered and adjusted on the basis of a recycling condition, and the recycled processing liquid may be supplied to the adjustment supply part.

The supplying the processing liquid may include: adjusting concentration of silica, wherein a supply amount of silica may be measured and the silica may be supplied to the substrate processing condition; supplying a processing liquid substance, wherein the processing liquid substance containing at least one of phosphoric acid and DIW may be supplied to an adjustment tank of the adjustment supply part; measuring concentration of phosphoric acid, wherein the processing liquid in the adjustment tank may be self-circulated through the adjustment circulation line and the concentration of the phosphoric acid is measured; and adjusting the supplied processing liquid, wherein, on the basis of a measuring result of the concentration of the phosphoric acid, the concentration of the phosphoric acid may be controlled by supplying at least one of the phosphoric acid and the DIW to the adjustment tank or heating at least one of the phosphoric acid and the DIW.

The supplying the processing liquid substance may be performed by supplying phosphoric acid solution mixing with the phosphoric acid and the DIW by the mixing means to the adjustment tank, and the adjusting the supplied processing liquid may be performed by supplying the phosphoric acid solution, in which phosphoric acid and DIW may be mixed together, through the mixing means to the adjustment tank to adjust the concentration of phosphoric acid.

The supplying the processing liquid substance may be performed by supplying the recycled processing liquid to a first adjustment tank of a first adjustment supply part and by supplying a new processing liquid substance to a second adjustment tank of a second adjustment supply part.

The supplying the processing liquid may include: sampling the processing liquid, wherein the processing liquid supplied from the main supply part to the substrate processing apparatus may be sampled and concentration of silica is measured; and adjusting the concentration of silica, wherein in response to a measuring result of the concentration of silica with respect to the sampled processing liquid, supply of the silica with respect to the adjustment supply part may be adjusted.

The supplying the processing liquid may include: sampling the processing liquid, wherein the processing liquid supplied from the main supply part to the substrate processing apparatus may be sampled and concentration of silica may be measured, and the recovering the processing liquid may include: discarding the recovered processing liquid, wherein the processing liquid recovered from the substrate processing apparatus to the recovery part may be drained out of the recovery part and be discarded, in response to a measuring result of the concentration of silica with respect to the sampled processing liquid.

The supplying the processing liquid substance may include counting the number of time the recycled processing liquid is recovered to the first adjustment tank of the first adjustment supply part, and the recovering the processing liquid may include, in response to the number of time the processing liquid is recovered, discarding the recovered processing liquid by draining the processing liquid recovered from the substrate processing apparatus to the recovery part to an outside of the recovery part.

The recovering the processing liquid may include: recovering the discarded processing liquid, wherein the processing liquid may be recovered from the substrate processing apparatus to the recovery tank; main-filtering the processing liquid, wherein the processing liquid discharged from the recovery tank may be distributed to a plurality of branch tubes and the processing liquid may be filtered through the main filter of each of the branch tubes; and supplying the recovered processing liquid, wherein the processing liquid discharged from the plurality of branch tubes may be supplied to the processing liquid recycling part.

The recycling the processing liquid may include: measuring concentration of moisture in phosphoric acid, wherein the processing liquid supplied to a recovery tank may be self-circulated through the recycling circulation line and the concentration of moisture in the phosphoric acid is measured; and recycling the processing liquid, wherein on the basis of a measuring result of the concentration of moisture in the phosphoric acid, the concentration of moisture in the phosphoric acid may be controlled by supplying DIW to the recovery tank or heating the processing liquid.

The supplying the processing liquid may be performed by selectively adjusting temperature and concentration of the processing liquid in at least one of a first adjustment supply part and a second adjustment supply part, and by supplying the adjusted processing liquid from a remaining one of the first and second adjustment supply parts to the main supply part or being supplied with the recycled processing liquid from the processing liquid recycling part, and the recycling the processing liquid may be performed by selectively adjusting the temperature and concentration of the processing liquid in at least one of the first processing liquid recycling part and the second processing liquid recycling part on the basis of the processing liquid recycling condition, and by being supplied with the processing liquid from the recovery part or by supplying the recycled processing liquid to the adjustment supply part by a remaining one of the first and second processing liquid recycling parts.

According to an embodiment of the present disclosure, a processing liquid supply device may include: an adjustment supply part including a first adjustment supply part supplied with recycled processing liquid and a second adjustment supply part supplied with new processing liquid, the adjustment supply part configured to self-circulate the processing liquid, to measure a supply amount of silica by a silica supply means and selectively supply the silica, to selectively supply phosphoric acid solution in which phosphoric acid and DIW may be mixed by the mixing means, to heat the processing liquid through an adjustment circulation line to adjust the processing liquid in response to substrate processing condition, and to supply the adjusted processing liquid to a main supply part; a processing liquid supply unit including the main supply part configured to sample the processing liquid while supplying the processing liquid to a substrate processing apparatus, and to allow the adjustment supply part to adjust concentration of silica in response to a concentration measuring result; a recovery part configured to recover the processing liquid from the substrate processing apparatus and filter the processing liquid by main filters arranged on a plurality of branch tubes to supply the processing liquid to a processing liquid recycling part; a processing liquid recycling unit including a plurality of processing liquid recycling parts configured to supply DIW while self-circulating the recovered processing liquid, or to recycle the processing liquid in response to the recycling condition by heating the processing liquid and to supply the recycled processing liquid to the first adjustment supply part; and a control unit configured to control supply, adjustment, recovering, recycling, or disposal of the processing liquid performed by the processing liquid supply unit and the processing liquid recycling unit, the control unit being configured to control any one of the first adjustment supply part and the second adjustment supply part to adjust the processing liquid and to control a remaining one of the first and second adjustment supply parts to supply the processing liquid to the main supply part, to control any one of the processing liquid recycling parts to recycle the processing liquid and to control a remaining one of the processing liquid recycling parts to be supplied with the processing liquid from the recovery part or to supply the recycled processing liquid to the first adjustment supply part, wherein the processing liquid supply unit and the processing liquid recycling unit may be arranged to be spatially separated from each other.

According to the present disclosure, the selectivity ratio of the substrate treatment process is improved, so that the substrate treatment properties can be maintained uniformly.

Moreover, when phosphoric acid solution containing silica is supplied and recovered and recycled during the process using the processing liquid containing phosphoric acid solution, the content of silica is maintained to a proper level and a stable temperature and concentration of the processing liquid of phosphoric acid solution can be maintained.

Specifically, with spatial divided arrangement of the main fab and the sub fab, the spatial limitation of the substrate processing system can be minimized and the supply and recycling of the processing liquid can be efficiently achieved.

According to the present disclosure, the plurality of adjustment supply parts is provided, so that any one of the adjustment supply parts can adjust the concentration and temperature of the processing liquid in response to the substrate processing condition, and a remaining one of the adjustment supply parts can supply the adjusted processing liquid to the main supply part or be supplied with the recycled processing liquid from the processing liquid recycling part. Accordingly, the processing liquid can be continuously supplied to the substrate processing apparatus.

In addition, according to the embodiment of the present disclosure, a plurality of processing liquid recycling parts is provided, so that any one of the processing liquid recycling parts can selectively adjust the concentration and temperature of the processing liquid on the basis of the processing liquid the recycling condition and a remaining one of the processing liquid recycling parts can be supplied with the processing liquid from the recovery part or supply the recycled processing liquid to the adjustment supply part. Therefore, the processing liquid can be continuously recycled.

Moreover, selective combination of operations of the plurality of adjustment supply parts and the plurality of processing liquid recycling parts can allow the continuous supply of the processing liquid and the continuous recycling of the processing liquid to be performed.

According to the embodiment of the present disclosure, the concentration of silica is adjusted or is discarded on the basis of the concentration of silica of the recycled processing liquid supplied to the substrate processing apparatus, whereby stable selectivity ratio of in the substrate treatment process can be achieved in response to the concentration of silica.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinbelow, preferred embodiments of the present disclosure will be described with reference to the accompanying drawings in order to describe the present disclosure, operational advantages of the present disclosure, and objectives achieved by embodiments of the present disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

In the following description, if it is decided that the detailed description of known function or configuration related to the invention makes the subject matter of the invention unclear, the detailed description is omitted.

The present disclosure discloses a processing liquid supply device and a processing liquid supply method. The processing liquid supply device and the processing liquid supply method are configured such that a processing liquid supply unit adjusts the supply amount of silica in order to improve a selectivity ratio during a substrate treatment process, processing liquid substances are mixed and the concentration and temperature of the processing liquid are adjusted on the basis of a substrate processing condition and the processing liquid is supplied to a substrate processing apparatus, a processing liquid recycling unit spatially separated from the processing liquid supply unit recovers the processing liquid and adjusts the concentration of moisture and temperature of the processing liquid to supply the processing liquid to the recycled processing liquid.

Figure 1:
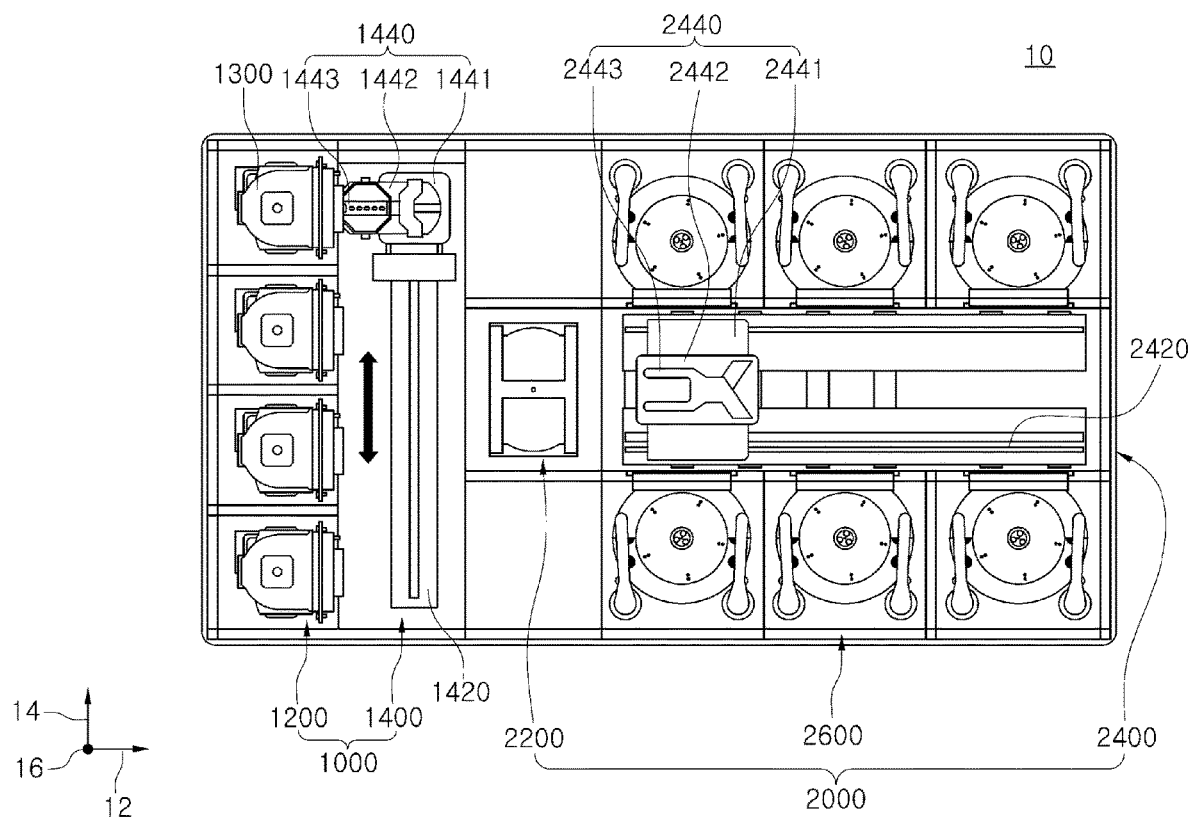
FIG. 1 is a plan view schematically showing a substrate processing system according to the present disclosure.

FIG. 1 is a plan view schematically showing a substrate processing system according to the present disclosure.

The substrate processing system to be described below describes one exemplary facility to which the present disclosure can be applied, but the present disclosure is not limited thereof, and is only intended to help understanding of the facility to which the present disclosure can be applied.

Referring to FIG. 1, the substrate processing system 1 includes an index module 1000 and a processing module 2000. The index module 1000 includes a load port 1200 and the transfer frame 1400. The load port 1200, the transfer frame 1400, and the processing module 2000 are sequentially arranged in a line. Hereinbelow, a direction in which the load port 1200, the transfer frame 1400, and the processing module 2000 are arranged is referred to a first direction 12. In a view from the top, a direction perpendicular to the first direction 12 is referred to a second direction 14, and a direction perpendicular to a plane including the first direction 12 and the second direction 14 is referred to a third direction 16.

A carrier 1300 storing a substrate W is seated on the load port 1200. A plurality of load ports 1200 is provided and arranged in a line along the second direction 14. In FIG. 1, the load ports are shown as four load ports 1200 are provided. However, the number of the load ports 1200 may increase or decrease in response to conditions such as the process efficiency or footprint of the processing module 2000. A slot (not shown) is provided on the carrier 1300 to support an edge of the substrate W. A plurality of slots may be provided in the third direction 16. The substrate W is located in the carrier 1300 such that substrates W are stacked with each other while being spaced apart along the third direction 16. As the carrier 1300, a front opening unified pod (FOUP) may be used.

The processing module 2000 includes a buffer unit 2200, the transfer chamber 2400, and process chambers 2600. The transfer chamber 2400 is arranged such that a longitudinal direction thereof is parallel to the first direction 12. The process chambers 2600 are arranged on first and second lateral portions of the transfer chamber 2400 in the second direction 14. Some of the process chambers 2600 at the first lateral portion of the transfer chamber 2400 and some of the process chambers 2600 at the second lateral portion of the transfer chamber 2400 are symmetrically provided to each other with the transfer chamber 2400 as the center. Some of the process chambers 2600 are arranged in the longitudinal direction of the transfer chamber 2400. Some of the process chambers 2600 are arranged to be stacked with each other. On the first lateral portion of the transfer chamber 2400, some of the process chambers 2600 may be arranged in an arrangement of A×B (each of A and B is a natural number greater than or equal to 1). A is the number of the process chambers 2600 provided in a line in the first direction 12, and B is the number of the process chambers 2600 provided in a line in the third direction 16. When four or six process chambers 2600 are provided on the first lateral portion of the transfer chamber 2400, the process chambers 2600 may have an arrangement of 2×2 or 3×2. The number of the process chambers 2600 may increase or decrease. Alternately, the process chambers 2600 may be provided only on the first lateral portion of the transfer chamber 2400. Furthermore, alternately, the process chambers 2600 may be provided on the first lateral portion and opposite lateral portions of the transfer chamber 2400 as a single layer.

The buffer unit 2200 may be arranged between the transfer frame 1400 and the transfer chamber 2400. The buffer unit 2200 provides a space in which the substrate W waits before being carried between the transfer chamber 2400 and the transfer frame 1400. The buffer unit 2200 has slots (not shown) in which the substrate W is placed, and the plurality of slots (not shown) are provided to be spaced apart from each other in the third direction 16. The buffer unit 2200 has a surface that faces the transfer frame 1400 and is open and a surface that faces the transfer chamber 2400 and is open.

The transfer frame 1400 carries the substrate W between the carrier 1300 seated on each of the load ports 1200 and the buffer unit 2200. The transfer frame 1400 has an index rail 1420 and an index robot 1440. The index rail 1420 is provided such that a longitudinal direction thereof is parallel to the second direction 14. The index robot 1440 is provided on the index rail 1420, and moves in the second direction 14 along the index rail 1420. The index robot 1440 has a base 1441, a body 1442, and an index arm 1443. The base 1441 is movably installed along the index rail 1420. The body 1442 is coupled to the base 1441. The body 1442 is provided in the third direction 16 on the base 1441. The body 1442 is rotatably provided on the base 1441. The index arm 1443 is coupled to the body 1442 and is provided to be movable forward and rearward with respect to the body 1442. A plurality of index arms 1443 is provided and independently driven. The index arms 1443 are arranged to be stacked with each other while being spaced apart from each other in the third direction 16. Some of the index arms 1443 may be used to carry the substrate W from the processing module 2000 to the carrier 1300, and others may be used to carry the substrate W from the carrier 1300 to the processing module 2000. Therefore, in a process of inserting in and taking out the substrate W by the index robot 1440, particles generated from a substrate W before the process may be prevented from being attached to a substrate W after the process.

The transfer chamber 2400 carries the substrate W between the buffer unit 2200 and each of the process chambers 2600 and between the process chambers 2600.

The transfer chamber 2400 includes a guide rail 2420 and a main robot 2440. The guide rail 2420 may be arranged such that a longitudinal direction thereof is parallel to the first direction 12. The main robot 2440 is provided on the guide rail 2420 and rectilinearly moves in the first direction 12 on the guide rail 2420. The main robot 2440 includes a base 2441, a body 2442, and a main arm 2443. The base 2441 is movably installed along the guide rail 2420. The body 2442 is coupled to the base 2441. The body 2442 is provided in the third direction 16 on the base 2441. The body 2442 is rotatably provided on the base 2441. The main arm 2443 is coupled to the body 2442 and is provided to be movable forward and rearward with respect to the body 2442. A plurality of main arms 2443 is provided and each of the main arms 2443 is driven individually.

The main arms 2443 are arranged to be stacked with each other while being spaced apart from each other in the third direction 16. One of the main arms 2443 used to carry the substrate W from the buffer unit 2200 to each of the process chambers 2600 and one of the main arms 2443 used to carry the substrate W from each of the process chambers 2600 to the buffer unit 2200 may be different from each other.

A substrate processing apparatus 10 is provided in each of the process chambers 2600 to perform a cleaning process with respect to the substrate W. The substrate processing apparatus 10 provided in each of the process chambers 2600 may have a different structure in response to a type of the cleaning process to be performed by the process chamber 2600. Selectively, the substrate processing apparatus 10 in each of the process chambers 2600 may have the same structure. Selectively, the process chambers 2600 may be divided into a plurality of groups. Substrate processing apparatuses 10 provided in some of the process chambers 2600 belonging to the same group may have the same structure, and substrate processing apparatuses 10 provided in some of the process chambers 2600 belonging to different groups may have different structures. For example, when the process chambers 2600 are divided into two groups, some of the process chambers 2600 in a first group may be provided on the first lateral portion of the transfer chamber 2400 and some of the process chambers 2600 in a second group may be provided on the second lateral portion of the transfer chamber 2400. The process chambers 2600 in the first group may be provided at a lower layer in each of the first and second lateral portions of the transfer chamber 2400, and the process chambers 2600 in the second group may be provided at an upper layer therein. The process chambers 2600 in the first group and the process chambers 2600 in the second group may be divided in response to a type of chemical used and a type of cleaning method used.

Hereinbelow, the process chambers 2600 will be described with the substrate processing apparatus 10 performing the substrate cleaning, striping, and organic residue removal by using processing fluids such as ozone processing fluids containing ozone, rinsing liquids, and drying gases, as an example.

Figure 2:
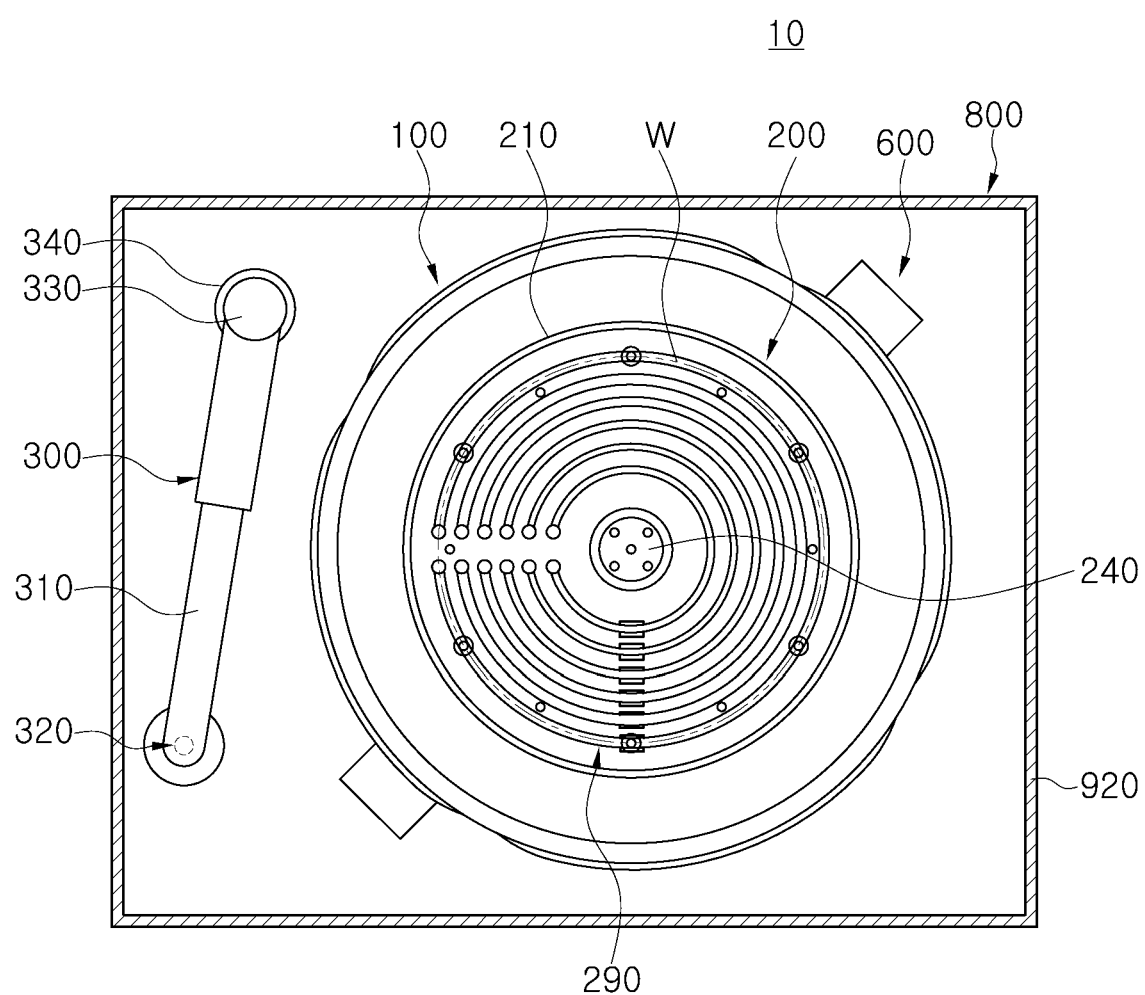
FIG. 2 is a plan view showing a substrate processing apparatus of the substrate processing system according to the present disclosure.
Figure 3:
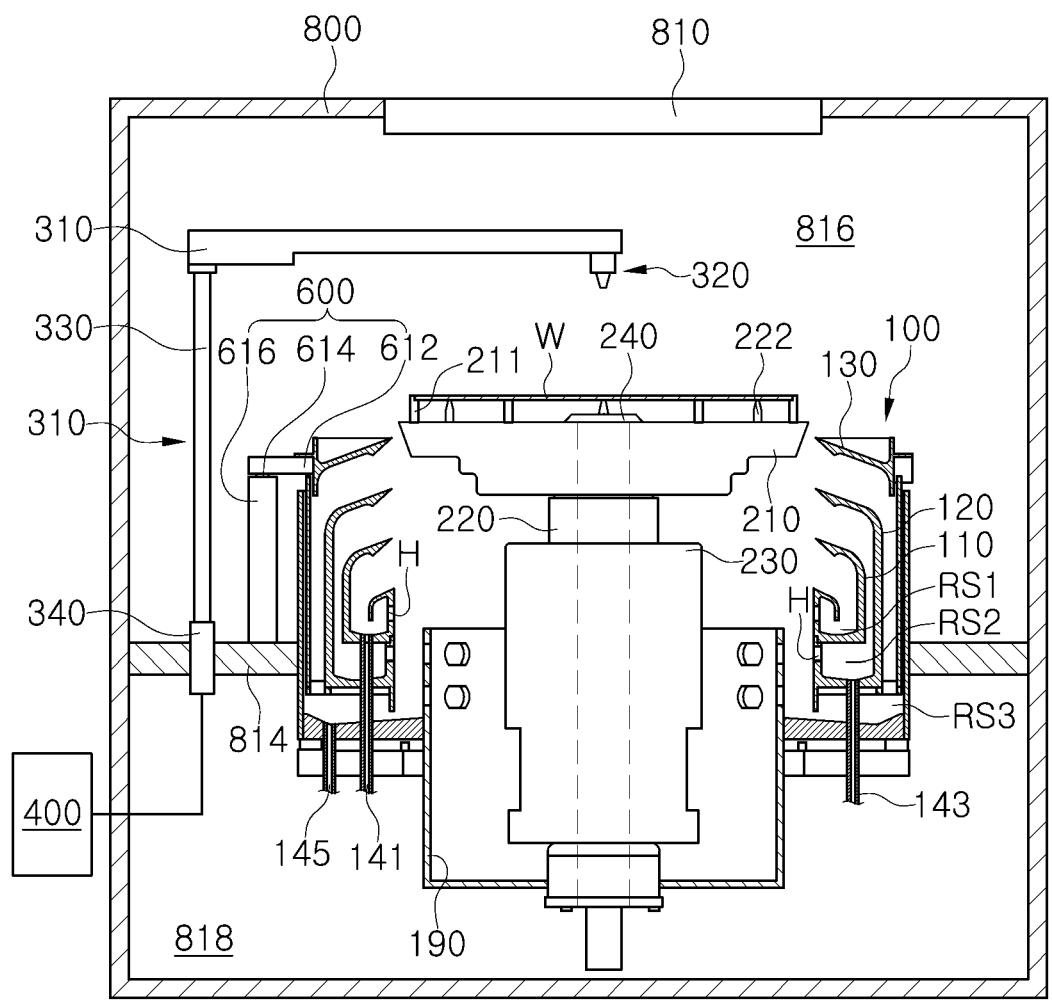
FIG. 3 is a sectional view showing the substrate processing apparatus of the substrate processing system according to the present disclosure.

FIG. 2 is a plan view showing the substrate processing apparatus in FIG. 1. FIG. 3 is a sectional view showing the substrate processing apparatus 10 in FIG. 1.

Referring to FIGS. 2 and 3, the substrate processing apparatus 10 includes a chamber 800, a processing container 100, a substrate support unit 200, a heating unit 290, a spray unit 300, a processing liquid supply unit 400, a process exhaust unit (not shown), a raising and lowering unit 600, and a processing liquid recycling unit (not shown).

The chamber 800 has an enclosed space therein. An air current supply unit 810 is provided at an upper portion of the chamber 800. The air current supply unit 810 generates a descending current in the chamber 800.

The air current supply unit 810 filters high-humidity external air and supplies the high-humidity external air into the chamber 800. The high-humidity external air is supplied into the chamber 800 by passing through the air current supply unit 810 and generates the descending current. The descending current provides a uniform current at an upper portion of the substrate W. The descending current discharges contaminants generated in the process of processing a surface of the substrate W by a processing fluid with the air through recovery containers 110, 120, and 130 of the processing container 100.

The chamber 800 is divided into a process area 816 and a maintenance area 818 by a horizontal partition wall 814. The processing container 100 and the substrate support unit 200 are located in the process area 816. In addition to recovery lines 141, 143, and 145 connected to the processing container 100, exhaust lines (not shown), a driving part of the raising and lowering unit 600, a driving part connected to the spray unit 300, a supply line, etc. are provided in the maintenance area 818. The maintenance area 818 is isolated from the process area 816.

The processing container 100 has a cylinder shape with an open upper portion and provides a process space for processing the substrate W. The open upper surface of the processing container 100 serves as paths for inserting and taking out the substrate W. The substrate support unit 200 is located in the process space of the processing container 100. The substrate support unit 200 rotates the substrate W while supporting the substrate W during the process.

The processing container 100 provides a lower space therein, the lower space of the processing container 100 being connected to an exhaust duct 190 to achieve the forces exhaust. The first to third recovery containers 110, 120, and 130 are arranged in multiple stages in the processing container 100. The recovery containers 110, 120, and 130 introduce and suction the processing liquid splashing from the rotated substrate W and gas.

The first to third recovery containers 110, 120, and 130 respectively have outlets H that communicate with a single common ring-shaped space.

Specifically, each of the first to third recovery containers 110, 120, and 130 has a ring-shaped bottom surface and a cylindrical side wall extending from the bottom surface. The second recovery container 120 surrounds the first recovery container 110, and is located while being spaced apart from the first recovery container 110. The third recovery container 130 surrounds the second recovery container 120, and is located while being spaced apart from the second recovery container 120.

The first to third recovery containers 110, 120, and 130 provide first to third recovery spaces RS1, RS2, and RS3 into which the processing liquid splashing from the substrate W and the current containing fumes flows. The first recovery space RS1 is defined as the first recovery container 110, the second recovery space RS2 is defined as a space between the first recovery container 110 and the second recovery container 120, the third recovery space RS3 is defined as a space between the second recovery container 120 and the third recovery container 130.

Each of the first to third recovery containers 110, 120, and 130 has an upper surface with an open center portion. Each of the first to third recovery containers 110, 120, and 130 is formed of an inclined surface of which a distance between the surface and a bottom surface gradually increases in a direction from a side wall connected to the inclined surface to the opening. The processing liquid splashing from the substrate W flows along an upper surface of each of the first to third recovery containers 110, 120, and 130 into the recovery spaces RS1, RS2, and RS3.

A first processing liquid flowing into the recovery space RS1 is discharged through a first recovery line 141 into the external processing liquid recycling unit (not shown). A second processing liquid flowing into the second recovery space RS2 is discharged through a second recovery line 143 into the external processing liquid recycling unit (not shown). A third processing liquid flowing into the third recovery space RS3 is discharged through a third recovery line 145 into the external processing liquid recycling unit (not shown).

Meanwhile, the processing container 100 is coupled to the raising and lowering unit 600 changing a vertical location of the processing container 100. The raising and lowering unit 600 moves the processing container 100 vertically. As the processing container 100 is moved vertically, a relative height of the processing container 100 with respect to the substrate support unit 200 is changed.

The raising and lowering unit 600 includes a bracket 612, a moving shaft 614, and an actuator 616. The bracket 612 is securely provided on an external wall of the processing container 100. The moving shaft 614 is securely provided at the bracket 612 and is vertically moved by the actuator 616. When the substrate W is loaded on a spin head 210 or unloaded from the spin head 210, the processing container 100 is lowered so that the spin head 210 is projected from the upper portion of the processing container 100. In addition, during the process, the height of the processing container 100 is adjusted so that the processing liquid flows into preset one of the recovery containers 110, 120, and 130 in response to a type of processing liquid supplied to the substrate W. Therefore, a relative vertical location between the processing container 100 and the substrate W is changed.

The processing container 100 may change a type of the processing liquid and the polluting gas recovered for each of the recovery spaces RS1, RS2, and RS3. According to the embodiment, the raising and lowering unit 600 vertically moves the processing container 100 to change a relative vertical location between the processing container 100 and the substrate support unit 200.

The substrate support unit 200 includes the spin head 210, a shaft 220, a driving part 230, and a lower surface nozzle assembly 240.

The shaft 220 connected to the spin head 210 is rotated by the driving part 230, whereby the substrate W mounted on the spin head 210 is rotated. The lower surface nozzle assembly 240, which is formed such that the shaft 220 penetrates the lower surface nozzle assembly 240, sprays the processing liquid on a rear surface of the substrate W. The spin head 210 has a support member provided to support the substrate W that has been spaced apart from the spin head 210. The support member includes a plurality of chuck pins 211 and a plurality of support pins 222. The plurality of chuck pins 211 is projected on an edge of an upper surface of the spin head 210 while being spaced apart from each other at predetermined intervals. The plurality of support pins 222 is projected on an inner portion of each of the chuck pins 211. The shaft 220 is connected to the spin head 210, and has a hollow shaft with an empty inside. The shaft 220 transmits a rotating force of the driving part 230, which will be described below, to the spin head 210.

The heating unit 290 is provided inside the substrate support unit 200. The heating unit 290 may heat the substrate W during the cleaning process. The heating unit 290 may be provided inside the spin head 210. Heating units 290 may have different diameters from each other. A plurality of heating units 290 may be provided. The heating units 290 may be formed in a ring shape. For example, the plurality of heating units 290 may be provided as a plurality of ring-shaped lamps. The heating units 290 may be divided into a plurality of concentric areas. Each of the concentric areas may have each lamp capable of separately heating each of the area. The lamps may have ring shapes, which are concentrically arranged with different radius with respect to the center of the spin head 210.

The spray unit 300 includes a nozzle support 310, a nozzle 320, a support shaft 330, and an actuator 340.

The support shaft 330 is provided such that a longitudinal direction thereof is parallel to the third direction 16, and the actuator 340 is coupled to a lower end of the support shaft 330.

The actuator 340 rotates and moves the support shaft 330 in a raising and lowering manner. The nozzle support 310 is perpendicularly coupled to an end of the support shaft 330, the end of the support shaft 330 being opposite to an end thereof coupled to the actuator 340. The nozzle 320 is provided on a lower surface of an end of the nozzle support 310. The nozzle 320 is moved to a process location and a waiting location by the actuator 340. The process location is a location where the nozzle 320 is provided at a vertically upper side of the processing container 100. The waiting location is a location where the nozzle 320 is moved out of the vertical upper side of the processing container 100. The nozzle 320 supplies the processing fluid onto the substrate W.

The processing liquid supply unit 400 supplies the processing fluid to the spray unit 300.

As the present disclosure is applied to the substrate processing system, the substrate processing system may be supplied with the processing liquid and the used processing liquid is recovered and recycled. Hereinbelow, the present disclosure will be described in detail according to an embodiment of the present disclosure.

The present disclosure may be applied to a wet etching process, a wet cleaning process, etc. that remove a film on a substrate surface. A various types of the processing liquids are used in the processes. In following embodiments, the processing liquid used in a substrate treatment process is described as a high-temperature phosphoric acid solution containing silica, but this is limited for convenience of description. the processing liquid that may be used in the present disclosure may include at least any one substance selected from hydrofluoric acid (HF), sulfuric acid (H3SO4), hydrogen peroxide (H2O2), nitric acid (HNO3), phosphoric acid (H3PO4), ozone water, SC-1 solution (a mixture of ammonium hydroxide (NH4OH), hydrogen peroxide (H2O2) and water (H2O)), which are used in the substrate treatment process. In addition, the present disclosure may include processing liquid of various substances that may be used in the substrate treatment process.

Figure 4:
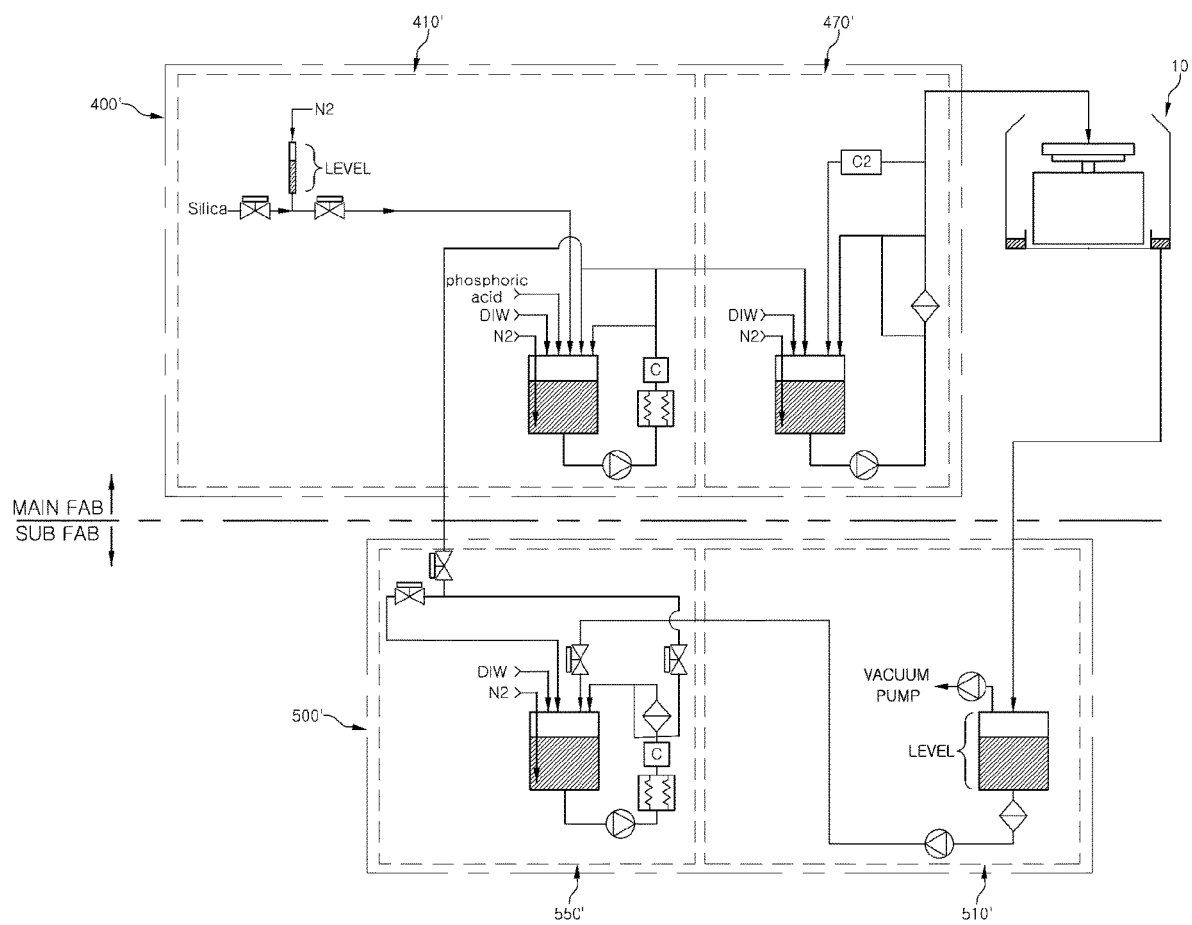
FIG. 4 is a block diagram showing a processing liquid supply device according to an embodiment of the present disclosure.

FIG. 4 is a block diagram showing a processing liquid supply device according to an embodiment of the present disclosure.

The processing liquid supply device according to the present disclosure may be divided into a main fab and a sub fab. The main fab may include a processing liquid supply unit 400', and the sub fab may include a processing liquid recycling unit 500'.

In a space in which the substrate processing apparatus 10 is arranged, in order to supply the processing liquid adjusted in the concentration and temperature thereof by the substrate processing apparatus 10 while maintaining a state thereof, the main fab may be arranged to be organically connected to the substrate processing apparatus 10 in the same space.

The sub fab may be arranged close to the main fab in the same space in order to supply the recycled processing liquid, but in some embodiments, the sub fab may be arranged in a separate space from the main fab.

As described above with reference to FIG. 1, the sub fab is arranged in the separate space from the space with the substrate processing apparatus 10, and thus recovers and recycles the used processing liquid. The sub fab may supply the recycled processing liquid to the processing liquid supply unit 400' of the main fab through a recycled processing liquid supply line.

With spatially divided arrangement of the main fab and the sub fab, the spatial limitation of the substrate processing system may be minimized and the supply and recycling of the processing liquid may be efficiently achieved.

According to the present disclosure, the processing liquid supply device may consist of the processing liquid supply unit 400', the processing liquid recycling unit 500', a control unit (not shown), etc.

The processing liquid supply unit 400' may include an adjustment supply parts 410' and a main supply part 470'. The adjustment supply parts 410' adjusts and supplies the processing liquid on the basis of the substrate processing condition. The main supply part 470' supplies the processing liquid to the substrate processing apparatus 10.

The processing liquid recycling unit 500' may include a recovery part 510' and a processing liquid recycling parts 550'. The recovery part 510' recovers the processing liquid from the substrate processing apparatus 10. The processing liquid recycling parts 550' is supplied with the recovered processing liquid from the recovery part 510' and recycles the recovered processing liquid, and supplies the recycled processing liquid to the adjustment supply parts 410' of the processing liquid supply unit 400'.

The control unit (not shown) may control the processing liquid supply unit 400' and the processing liquid recycling unit 500' with respect to the supply, adjustment, recovery, recycling, or disposal of the processing liquid.

In the embodiment in FIG. 4, a single adjustment supply part 410' is arranged in the processing liquid supply unit 400', and a single processing liquid recycling part 550' is arranged in the processing liquid recycling unit 500'. However, the number of the adjustment supply parts 410' of the processing liquid supply unit 400' and the number of the processing liquid recycling parts 550' of the processing liquid recycling unit 500' may be changed as needed.

Figure 5:
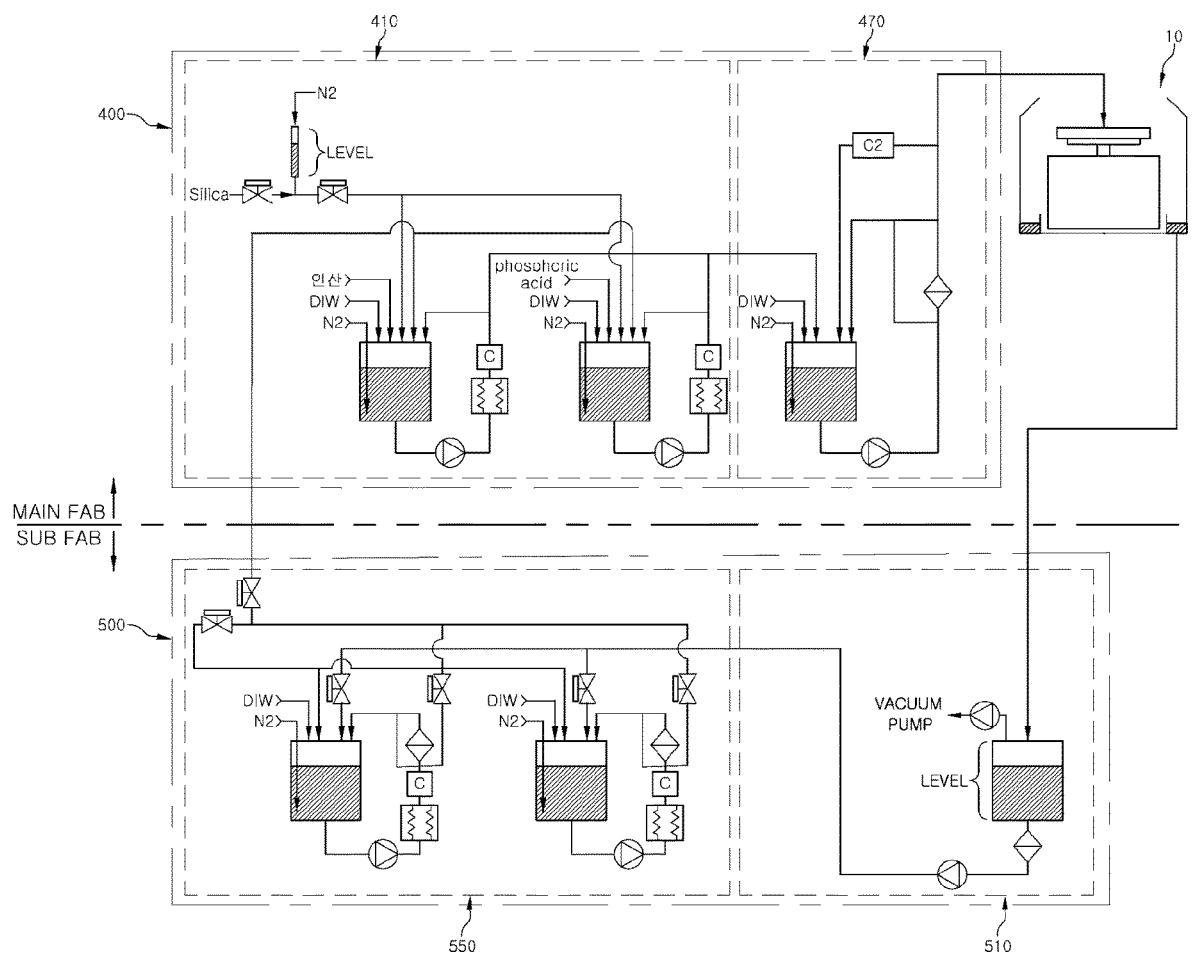
FIG. 5 is a block diagram showing the processing liquid supply device according to an embodiment of the present disclosure.

FIG. 5 is a block diagram showing the processing liquid supply device according to an embodiment of the present disclosure.

The embodiment of FIG. 5 has a basic structural arrangement similar to the embodiment of FIG. 4. However, the processing liquid supply unit 400 includes two adjustment supply parts 410 arranged in parallel, and a processing liquid recycling unit 500 includes two processing liquid recycling parts 550 arranged in parallel.

With the parallel arrangement of the plurality of adjustment supply parts 410, any one of the adjustment supply parts 410 supplies the processing liquid, which is adjusted in the concentration and temperature on the basis of the substrate processing condition, to a main supply part 470. At the same time, a remaining one of the adjustment supply parts 410 may perform adjustment of the concentration and temperature of the processing liquid on the basis of the substrate processing condition.

Furthermore, with the parallel arrangement of the plurality of the processing liquid recycling parts 550, any one of the processing liquid recycling parts 550 is supplied with the used processing liquid from a recovery part 510 and recycles the processing liquid. At the same time, a remaining one of the processing liquid recycling parts 550 may supply the recycled processing liquid to any one of the plurality of adjustment supply parts 410.

With the configuration of the plurality of adjustment supply parts 410 and the plurality of processing liquid recycling parts 550, the continuous adjustment and recycling of the processing liquid may be achieved, and the adjusted processing liquid may be continuously supplied to the substrate processing apparatus 10. Accordingly, the processing liquid supply efficiency may be improved.

Hereinbelow, detailed structures of the processing liquid supply unit 400 and the processing liquid recycling unit 500 will be described with reference to the embodiments. The embodiment of FIG. 5 is based on the embodiment of FIG. 4, and a detailed structure of the embodiment of FIG. 5 will be described with reference to FIGS. 6 to 10.

Figure 6:
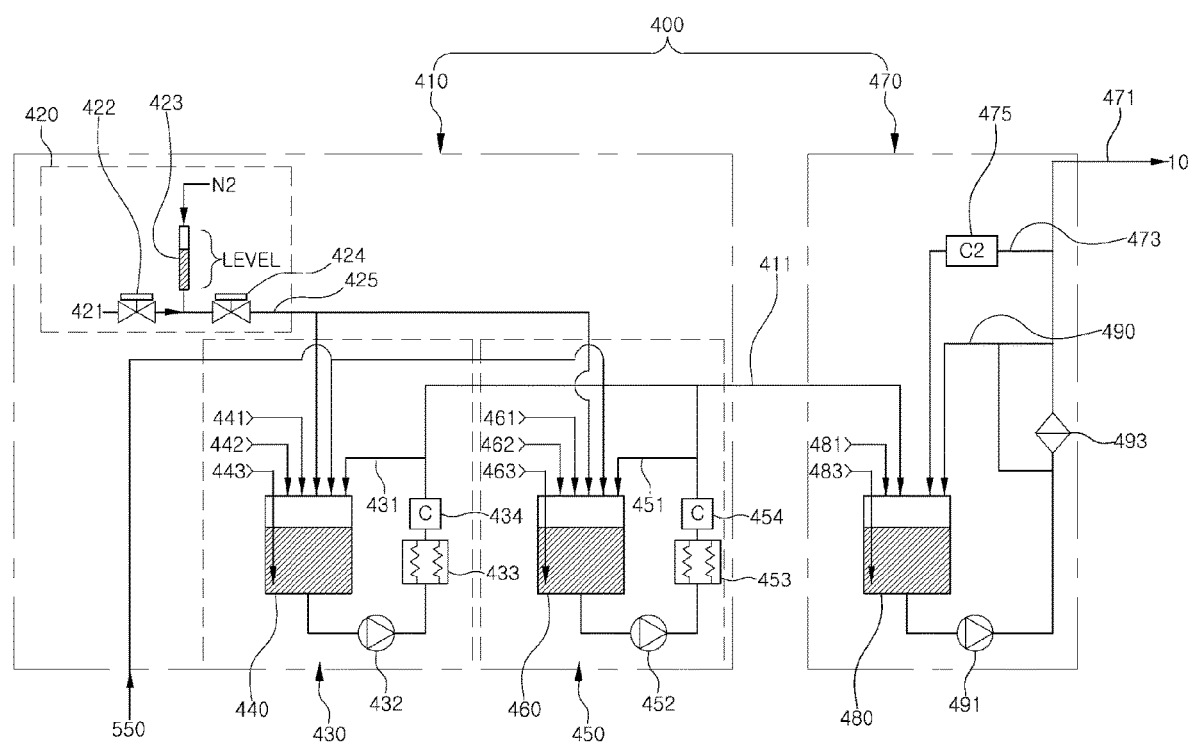
FIG. 6 is a block diagram showing a processing liquid supply unit of the processing liquid supply device an embodiment of the present disclosure.

FIG. 6 is a block diagram showing a processing liquid supply unit of the processing liquid supply device an embodiment of the present disclosure.

The processing liquid supply unit 400 includes the main supply part 470 and the adjustment supply parts 410. The main supply part 470 supplies the processing liquid to the substrate processing apparatus 10. The adjustment supply parts 410 adjusts the processing liquid on the basis of the substrate processing condition and supplies the adjusted processing liquid to the main supply part 470.

The adjustment supply parts 410 may include a first adjustment supply part 430 and a second adjustment supply part 450. A silica supply means 420 (i.e., a silica supplier) may be provided to supply silica to each of the first adjustment supply part 430 and the second adjustment supply part 450.

The silica supply means 420 includes a silica supply part 421 and a silica measurement tube 423. The silica supply part 421 supplies silica, and the silica measurement tube 423 measures a supply amount of silica supplied from the silica supply part 421, on the basis of the substrate processing condition, to supply a required amount of silica to each of the first adjustment supply part 430 and the second adjustment supply part 450. Furthermore, the silica supply means 420 includes a silica adjustment valve 422 and a silica supply valve 424. The silica adjustment valve 422 limits the supply of silica from the silica supply part 421 to the silica measurement tube 423. The silica supply valve 424 selectively supplies the required amount of silica measured by the silica measurement tube 423 to each of the first adjustment supply part 430 and the second adjustment supply part 450.

The first adjustment supply part 430 may include: a first adjustment tank 440 storing the processing liquid therein; a substance supply means (e.g., a substance supply inlet) 441, 442 supplying a processing liquid substance such as phosphoric acid or DIW to the first adjustment tank 440; and an inert gas supply means 443 supplying pressure for discharging the processing liquid stored in the first adjustment tank 440. The inert gas may be nitrogen gas ($N_2$).

The first adjustment supply part 430 may include a first adjustment circulation line 431. The first adjustment circulation line 431 self-circulates the processing liquid of the first adjustment tank 440 and adjusts the processing liquid in response to the substrate processing condition. A first mixing line pump 432, a first mixing line heater 433, and a measurement means may be arranged in the first adjustment circulation line 431. The first mixing line pump 432 circulates the processing liquid in the first adjustment tank 440, the first mixing line heater 433 heats the circulated processing liquid, and the measurement means measures the concentration and temperature of the processing liquid. The measurement means may include a first phosphoric acid concentration meter 434 measuring the phosphoric acid concentration of phosphoric acid solution and a temperature (not shown) measuring the temperature of the phosphoric acid solution. In some embodiments, a chemical-resistant pump may be applied as the first mixing line pump 432. As an embodiment, a diaphragm pump may be applied so as to transport of small amounts of the processing liquid, and a bellows pump and a magnetic pump may be applied so as to transport of large amounts of the processing liquid. Alternately, a metering pump may be applied in order to precisely circulate a predetermined amount of mixture.

Although not shown in FIG. 6, a control valve may be provided. The control valve self-circulates the processing liquid through the first adjustment circulation line 431 or discharges the adjusted processing liquid to an adjustment processing liquid supply tube 411. A three way valve or a four way valve may be applied as the control valve. For example, when the processing liquid is self-circulated, the control valve is closed so that the processing liquid is circulated to the first adjustment circulation line 431. When the adjusted processing liquid is supplied, the control valve is opened so that the adjusted processing liquid may be discharged to the adjustment processing liquid supply tube 411.

The second adjustment supply part 450 may have a structure similar to the structure of the first adjustment supply part 430. The second adjustment supply part 450 may include a second adjustment tank 460, a substance supply means 461, 462 supplying the processing liquid such as phosphoric acid or DIW, and an inert gas supply means 463 supplying pressure for discharging the processing liquid stored in the second adjustment tank 460.

In addition, the second adjustment supply part 450 may have a second adjustment circulation line 451 that is provided to self-circulate the processing liquid in the second adjustment tank 460. A second mixing line pump 452, a second mixing line heater 453, a second phosphoric acid concentration meter 454 and a thermometer sensor as the measurement means, etc. may be arranged in second adjustment circulation line 451.

A control valve may be also provided in the second adjustment supply part 450. The control valve of the second adjustment supply part 450 is provided for self-circulation of the processing liquid through the second adjustment circulation line 451 or for discharge of the processing liquid to the adjustment processing liquid supply tube 411.

The first adjustment supply part 430 and the second adjustment supply part 450 are arranged in parallel and individually operated simultaneously or concurrently. The first adjustment supply part 430 and the second adjustment supply part 450 may adjust the processing liquid in response to the substrate processing condition and then selectively supply the adjusted processing liquid to the adjustment processing liquid supply tube 411.

The adjustment processing liquid supply tube 411 may have a flowmeter (not shown) so as to measure a supply amount and a flow rate of the adjusted processing liquid.

The processing liquid adjusted in the adjustment supply parts 410 is selectively discharged from at least one of the first adjustment supply part 430 and the second adjustment supply part 450 to the adjustment processing liquid supply tube 411 so as to be supplied to the main supply part 470.

The operation of the adjustment supply part 410 is controlled by the control unit. The control unit controls the silica supply means 420 to supply the supply amount of silica in response to the substrate processing condition and to selectively supply of the required amount of silica to the first adjustment supply part 430 and the second adjustment supply part 450. In addition, the control unit controls each of the substance supply means 441, 442, 461, 462 to selectively supply the substance, and selectively self-circulate the processing liquid through the first adjustment circulation line 431 and the second adjustment circulation line 451 so as to adjust the concentration and temperature of phosphoric acid.

In some embodiments, the control unit may control any one of the first adjustment supply part 430 and the second adjustment supply part 450 to adjust the processing liquid. The control unit may control a remaining one of the first and second adjustment supply parts to supply the processing liquid to the main supply part 470 or be supplied with the processing liquid from the processing liquid recycling parts 550.

In the main supply part 470, the main supply part 470 may include a main supply tank 480, a substance supply means 481, and an inert gas supply means 483. The main supply tank 480 stores the adjusted processing liquid, the substance supply means 481 supplies the processing liquid substance such as DIW to the main supply tank 480. The inert gas supply means 483 supplies a pressure for discharging the processing liquid stored in the main supply tank 480.

Furthermore, the main supply part 470 includes a processing liquid supply tube 471 and a processing liquid supply pump 491. The processing liquid supply tube 471 supplies the adjusted processing liquid from the main supply tank 480 to the substrate processing apparatus 10, and the processing liquid supply pump 491 supplies the processing liquid from the main supply tank 480 to the processing liquid supply tube 471. The processing liquid supply tube 471 may include a processing liquid supply tube filter 493 that filters the processing liquid supplied to the substrate processing apparatus 10.

Furthermore, the processing liquid supply tube 471 may include a flowmeter (not shown) so as to measure a supply amount and a flow rate of the processing liquid supplied to the substrate processing apparatus 10.

Furthermore, the main supply part 470 may include a sampling line 473 and a measurement means. The sampling line 473 samples the processing liquid supplied from the main supply tank 480, and the measurement means measures the processing liquid of the sampling line 473. The measurement means may include a silica concentration meter 475 measuring the concentration of silica contained in the processing liquid.

In response to a measuring result of the sampled processing liquid, a supply processing liquid recovery line 490 may be provided for properly recovering the processing liquid that is not adjusted.

The supply processing liquid recovery line 490 may be connected to the main supply tank 480, so that the processing liquid is recovered to the main supply tank 480 on the basis of the measured silica concentration. When necessary, the supply processing liquid recovery line 490 has a drain valve so as to discharge the processing liquid that exceeds a preset concentration of silica to the outside and to discard the processing liquid.

The operation of the main supply part 470 is controlled by the control unit. The control unit controls such that the processing liquid is supplied from the main supply tank 480 to the substrate processing apparatus 10 through the processing liquid supply tube 471, while sampling the processing liquid supplied through the sampling line 473 and inspecting whether the processing liquid is properly adjusted. For example, the control unit may measure the concentration of silica or the temperature of the processing liquid, and on the basis of a measuring result, control the supply of silica to the adjustment supply parts 410 or heating temperature. In addition, when the sampled processing liquid does not satisfy a predetermined level of the substrate processing condition, the control unit may recover the processing liquid supplied to the substrate processing apparatus 10 to drain and discard the processing liquid to the outside through the supply processing liquid recovery line 490.

According to the present disclosure, the processing liquid supply unit may be variously deformed in the processing liquid supply device. Embodiments of the deformed processing liquid supply unit will be described.

In describing the embodiments of the processing liquid supply unit, when a structure thereof is the same as the embodiment of the processing liquid supply unit in FIG. 6, the description thereof will be omitted.

The structure of supplying the processing liquid substance may be changed. In the embodiment of FIG. 6, the substance supply means 441, 442, 461, 462 directly supplying the processing liquid substance such as phosphoric acid or DIW to the first adjustment tank 440 or the second adjustment tank 460 is provided. Otherwise, a mixing means (i.e., a mixer) may be provided to supply the phosphoric acid solution, in which phosphoric acid and DIW are mixed together to the adjustment tank 440, 460 in response to the substrate processing condition.

The mixing means is supplied with the processing liquid substance such as phosphoric acid or DIW and the phosphoric acid solution in which phosphoric acid or DIW is mixed is generated and is supplied to the adjustment tank 440, 460, so that new processing liquid may be generated or adjustment of the processing liquid may be achieved.

Figure 7:
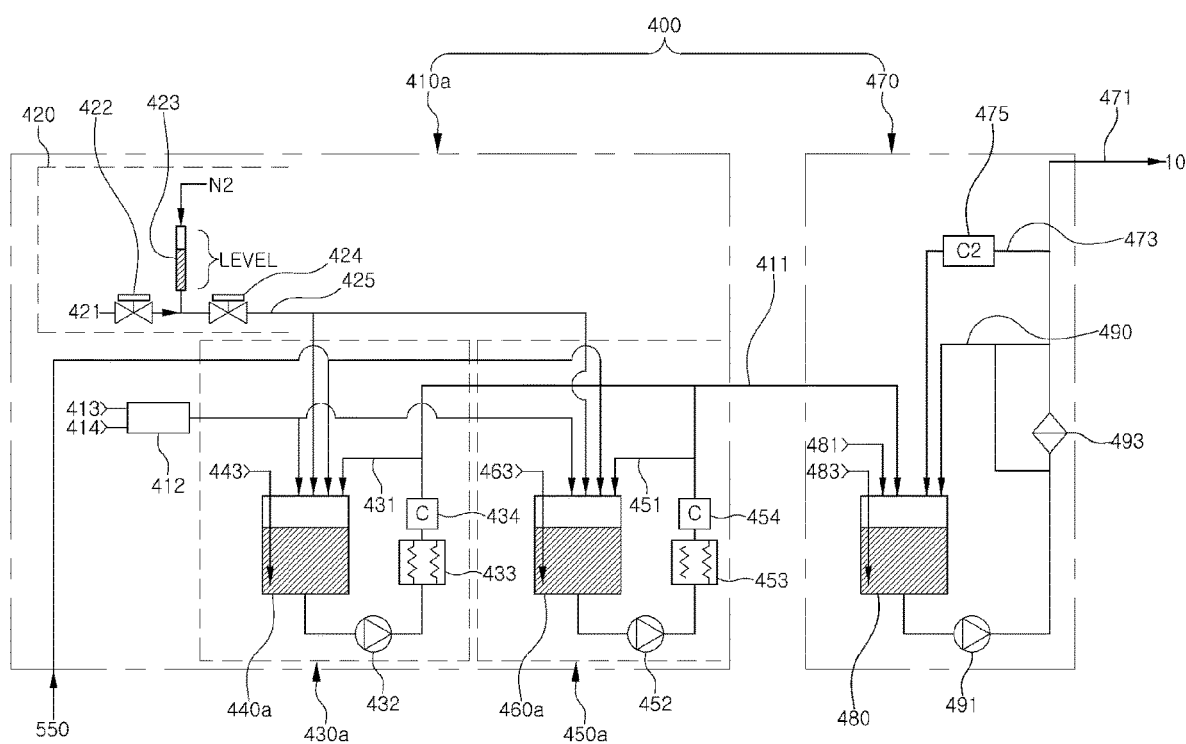
FIG. 7 is a block diagram showing the processing liquid supply unit of the processing liquid supply device according to an embodiment of the present disclosure.
Figure 8:
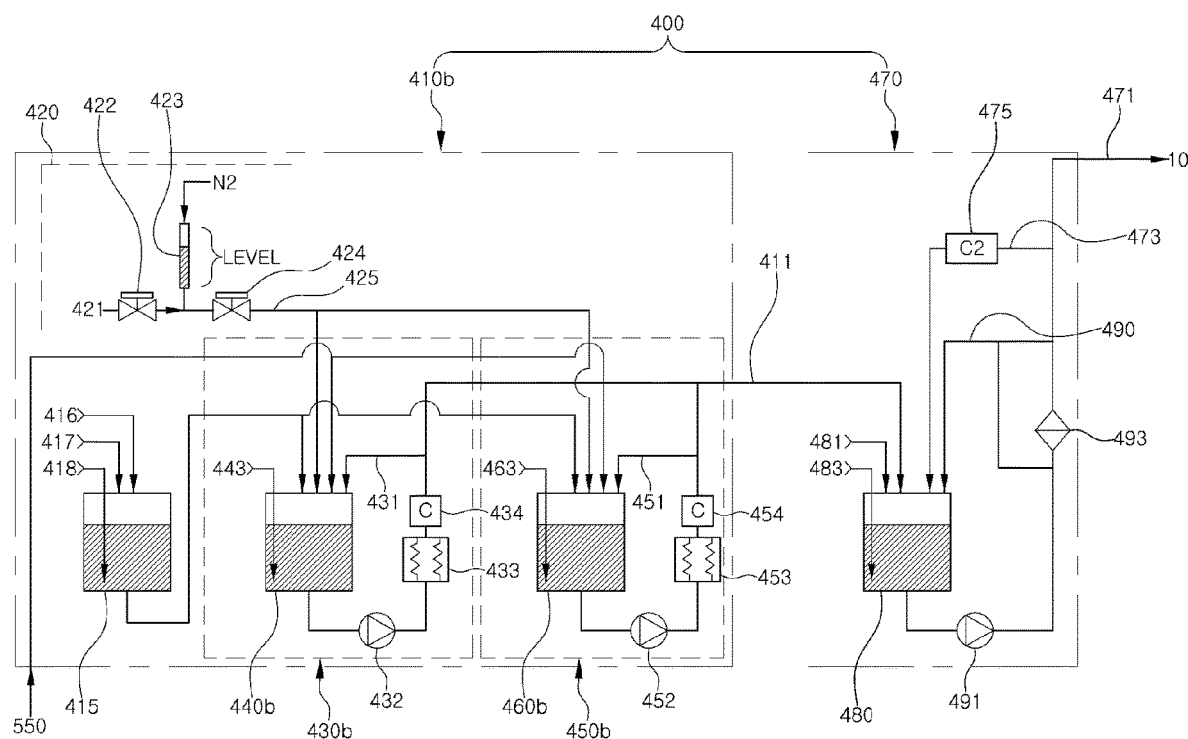
FIG. 8 is a block diagram showing the processing liquid supply unit of the processing liquid supply device according to other embodiment of the present disclosure.

FIGS. 7 and 8 are block diagrams showing the processing supply unit of the processing supply device according to other embodiment of the present disclosure.

In FIG. 7, an adjustment supply part 400a includes a mixer 412 as the mixing means. The mixer 412 is arranged on a processing liquid substance supply line of the substance supply means 413, 414 supplying the processing liquid substance such as phosphoric acid or DIW.

The mixer 412 is supplied with the processing liquid substance such as phosphoric acid and DIW from the substance supply mean 413, 414, and mixes phosphoric acid and DIW to generate the phosphoric acid solution. In response to the substrate processing condition, the mixer 412 selectively supplies the phosphoric acid solution to a first adjustment tank 440a of a first adjustment supply part 430a and a second adjustment tank 460a of a second adjustment supply part 450a.

The first adjustment tank 440a and the second adjustment tank 460a are not respectively supplied with each of the substances to mix the substances into the phosphoric acid solution, but the mixer 412 supplies the phosphoric acid solution to the first adjustment tank 440a and the second adjustment tank 460a.

In FIG. 8, an adjustment supply part 400b includes a mixing tank 415 as the mixing means. The substance supply means 416, 417 is arranged to supply the processing liquid substance such as phosphoric acid or DIW to the mixing tank 415. Furthermore, the mixing tank 415 may include an inert gas supply means 418 for providing the pressure for discharging and supplying the mixed phosphoric acid solution.

The mixing tank 415 is supplied with the processing liquid substance such as phosphoric acid and DIW from the substance supply mean 416, 417, and mixes phosphoric acid and DIW to generate the phosphoric acid solution. In response to the substrate processing condition, the mixing tank 415 selectively supplies the phosphoric acid solution to a first adjustment tank 440b of a first adjustment supply part 430b and a second adjustment tank 460b of a second adjustment supply part 450b.

The first adjustment tank 440b and the second adjustment tank 460b are not respectively supplied with each of the substances to mix the substances into the phosphoric acid solution, but the mixing tank 415 supplies the phosphoric acid solution to the first adjustment tank 440b and the second adjustment tank 460b.

As described above, as the first adjustment supply part and the second adjustment supply part are supplied with the phosphoric acid solution with respect to the substrate processing condition, it becomes easier to adjust the processing liquid and the processing liquid adjustment time may be reduced, so that continuous supply of the processing liquid may be efficiently performed.

Moreover, the processing liquid supply unit may be configured such that a plurality of the adjustment supply parts respectively performs different functions. In this regard, FIG. 9 is a block diagram showing an embodiment of the processing liquid supply unit in the processing liquid supply device according to the present disclosure.

Figure 9:
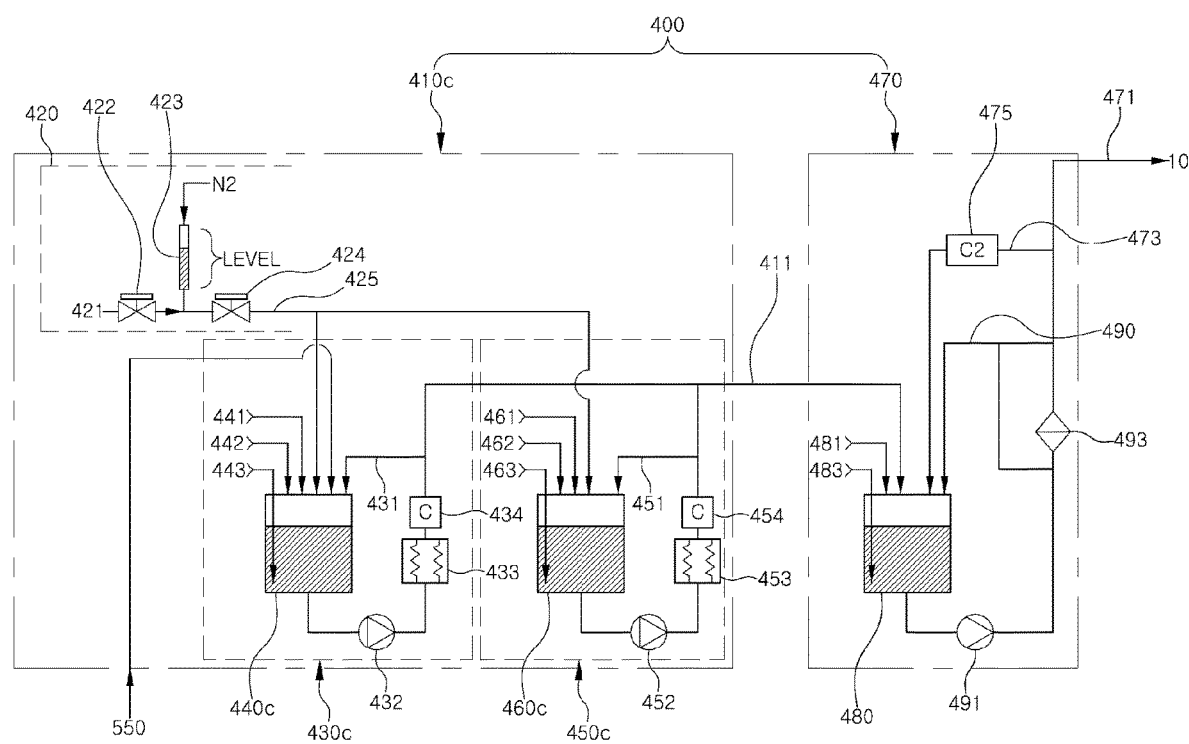
FIG. 9 is a block diagram showing the processing liquid supply unit of the processing liquid supply device according to other embodiment of the present disclosure.

In the embodiment of FIG. 9, a first adjustment supply part 430c is supplied with the processing liquid from the processing liquid recycling parts 550, and a second adjustment supply part 450c is supplied with new processing liquid.

The first adjustment supply part 430c is supplied with the recycled processing liquid from the processing liquid recycling parts 550 and stores the recycled processing liquid into a first adjustment tank 440c. Then, the first adjustment supply part 430c self-circulates the processing liquid through the first adjustment circulation line 431 to adjust the concentration and temperature of the processing liquid, and supplies the adjusted processing liquid to the main supply part 470.

Otherwise, the second adjustment supply part 450c is supplied with a new processing liquid substance and stores the new processing liquid substance into a second adjustment tank 460c. Then, the second adjustment supply part 450c self-circulates the processing liquid substance through the second adjustment circulation line 451 to adjust the concentration and temperature of the processing liquid, and supplies the adjusted processing liquid to the main supply part 470.

Moreover, the first adjustment supply part 430c may adjust a recycled processing liquid and then supply the processing liquid to the second adjustment supply part 450c.

According to the present disclosure, the silica concentration, phosphoric acid concentration, the processing liquid temperature, etc. suitable for the substrate processing condition are adjusted through various processing liquid supply units. Therefore, the processing liquid may be supplied to the substrate processing apparatus 10 in an optimal state.

Figure 10:
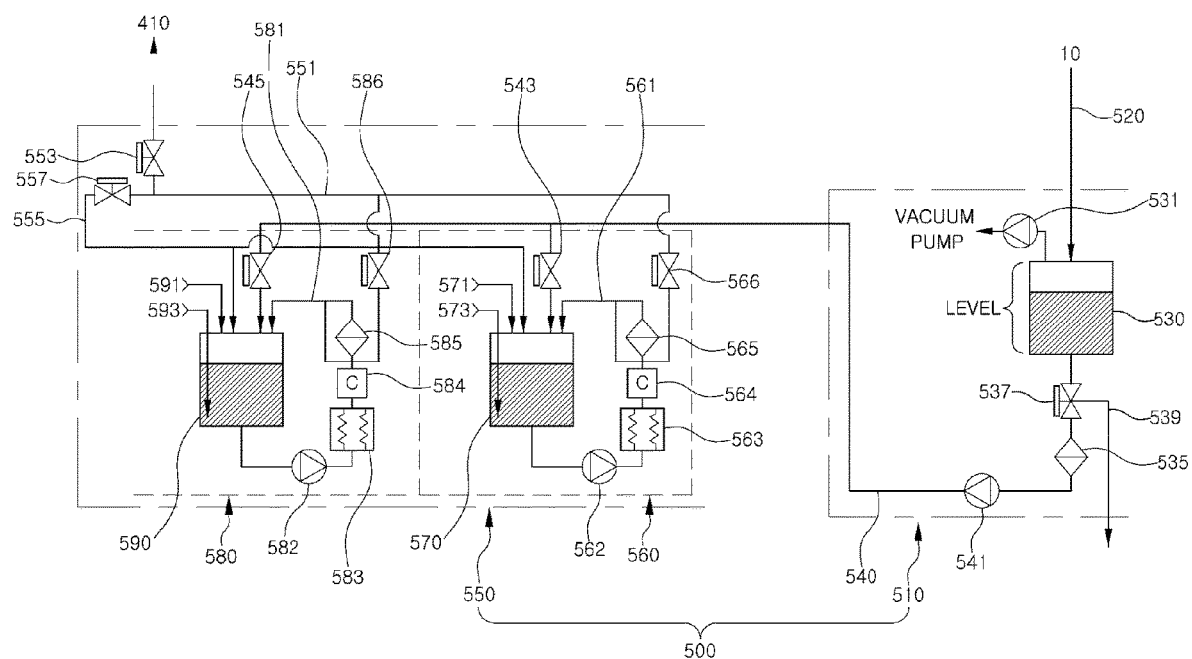
FIG. 10 is a block diagram showing a processing liquid recycling unit of the processing liquid supply device according to an embodiment of the present disclosure.
Figure 11:
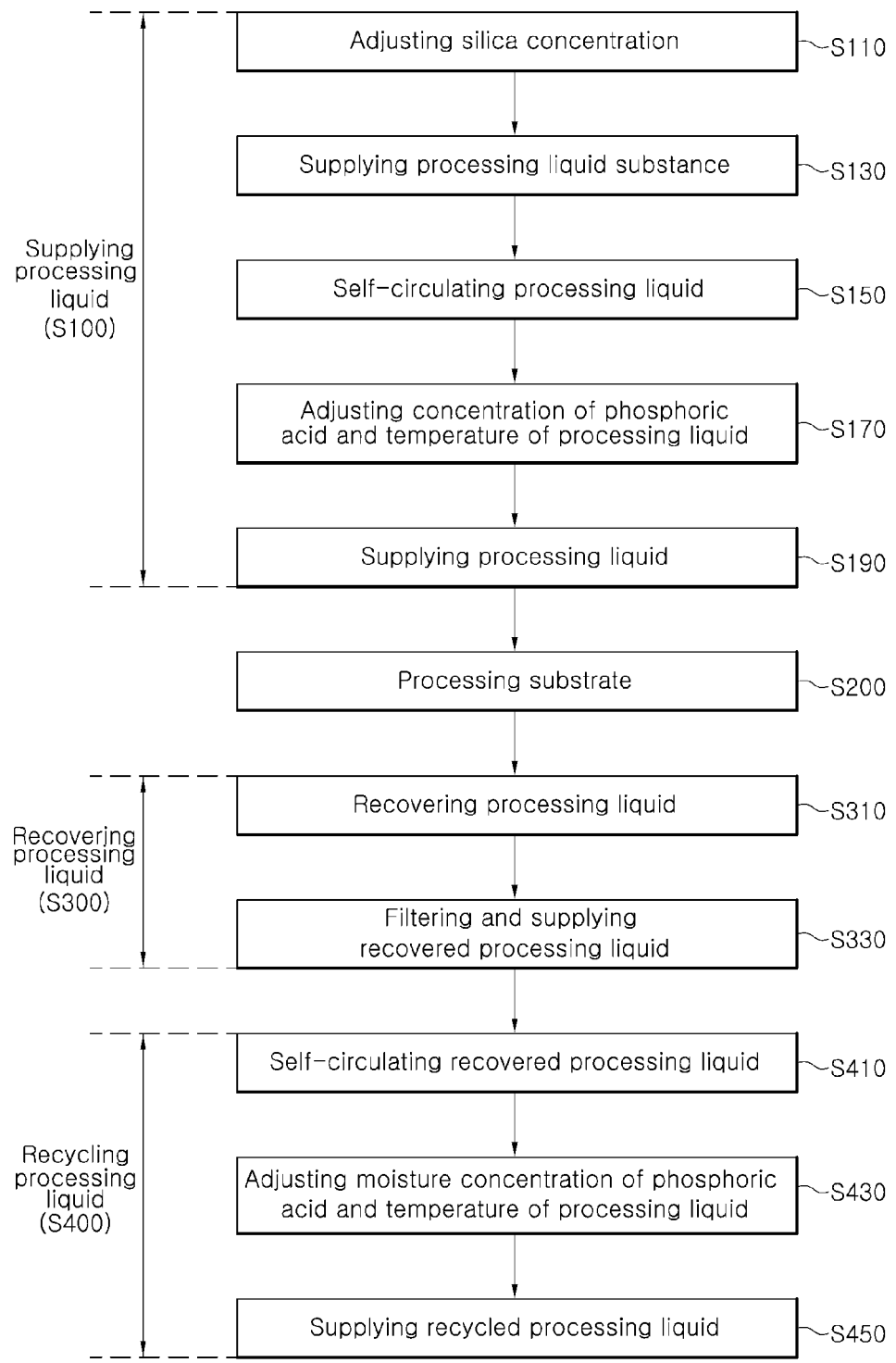
FIG. 11 is a flowchart showing a processing liquid supply method according to an embodiment of the present disclosure.

The processing liquid recycling unit 500 will be described with reference to a block diagram showing an embodiment of the processing liquid recycling unit in the processing liquid supply device according to the present disclosure as shown in FIG. 10.

The processing liquid recycling unit 500 may be spatially separated from the processing liquid supply unit 400 and may be arranged in a separate system. In order to release a spatial limitation of the substrate processing system, the processing liquid recycling unit 500 is provided as a separate apparatus from the processing liquid supply unit 400, and the processing liquid recycling unit 500 may be arranged in the spatially different location.

The processing liquid recycling unit 500 may include the recovery part 510 recovering the used waste processing liquid from the substrate processing apparatus 10 and the processing liquid recycling parts 550 recycling the waste processing liquid recovered from the recovery part 510 and supplying the waste processing liquid to the adjustment supply parts 410 of the processing liquid supply unit 400.

The recovery part 510 may include a waste processing liquid supply tube 520 and a recovery tank 530. The waste processing liquid supply tube 520 is supplied with the waste processing liquid from the substrate processing apparatus 10, and the recovery tank 530 is connected to the waste processing liquid supply tube 520 and temporarily stores the waste processing liquid.

Furthermore, the recovery part 510 may include a recovered processing liquid supply tube 540 and a recovery tube pump 531. The recovered processing liquid supply tube 540 supplies the waste processing liquid stored in the recovery tank 530 into the processing liquid recycling parts 550, and the recovery tube pump 531 discharges the waste processing liquid stored in the recovery tank 530 to the recovered processing liquid supply tube 540.

The recovery part 510 may include a drain valve 537 and a waste processing liquid discharge tube 539 that drain the waste processing liquid recovered to the recovery tank 530 to the outside and discard the waste processing liquid. The recovery part 510 may include a silica concentration meter (not shown) for measuring the concentration of silica in the processing liquid. In some embodiments, the drain valve 537 may be a three way valve, and selectively transport the processing liquid discharged from the recovery tank 530 to the recovered processing liquid supply tube 540 or discharge the processing liquid to the waste processing liquid discharge tube 539.

In addition, the recovery part 510 may include a main filter 535. The main filter 535 filters foreign substances when the waste processing liquid is supplied to the processing liquid recycling parts 550 through the recovered processing liquid supply tube 540.

Moreover, when the high-temperature waste processing liquid is filtered by the main filter 535, physical properties of a resin filter with respect to the high-temperature treatment liquid are lowered. Accordingly, an allowable pressure range for proper filtering is lowered. Therefore, filtering for the supply amount of the waste processing liquid above a predetermined level may not be properly performed.

In order to release the above problem, the present disclosure is configured such that a plurality of branch tubes is provided on an intermediate portion of the recovered processing liquid supply tube 540, and the main filter may be arranged for each of the branch tubes. The recovered processing liquid supply tube 540 between an outlet tube of the recovery tank 530 and an inlet tube of the processing liquid recycling parts 550 is arranged as the plurality of branch tubes. As a separate main filter is arranged for each of the branch tubes, the supply amount of the processing liquid is distributed and filtered by each main filter so that the filtering performance may be improved.

The control unit controls the operation of the recovery part 510, and the control unit controls that the waste processing liquid is stored in the recovery tank 530 of the recovery part 510 and the waste processing liquid supplied in the recovery tank 530 is supplied to the processing liquid recycling parts 550 or drained to the outside so as to be discarded. In some embodiments, the control unit may control one of a first processing liquid recycling part 560 and a second processing liquid recycling part 580 of the processing liquid recycling parts 550 to be supplied with the waste processing liquid, in response to operations of the first processing liquid recycling part 560 and the second processing liquid recycling part 580.

Hereinbelow, the processing liquid recycling parts 550 will be described.

The waste processing liquid recovered from the recovery part 510 is filtered and supplied to the processing liquid recycling parts 550. The waste processing liquid may be recycled in the processing liquid recycling parts 550 into a processing liquid with an available proper level.

The processing liquid recycling parts 550 may include the first processing liquid recycling part 560 and the second processing liquid recycling part 580. The first processing liquid recycling part 560 includes a first recovery tank 570 in which the processing liquid supplied from the recovery part 510 is stored. A first recovery processing liquid supply valve 543 may control the supply of the processing liquid supplied from the recovered processing liquid supply tube 540 to the first recovery tank 570.

The first processing liquid recycling part 560 may include a processing liquid substance supply tube 571 and an insert gas supply means 573. The processing liquid substance supply tube 571 supplies DIW to the first recovery tank 570 and the insert gas supply means 573 provides the pressure for discharging the processing liquid stored in the first recovery tank 570. The inert gas may be nitrogen gas (N2).

In addition, the first processing liquid recycling part 560 may include a first recycling circulation line 561 that self-circulates the processing liquid in the first recovery tank 570 and recycling the processing liquid. The first recycling circulation line 561 may include a first recycling line pump 562, a first recycling line heater 563, and a measurement means. The first recycling line pump 562 circulates the processing liquid in the first recovery tank 570, the first recycling line heater 563 heats the processing liquid in circulation, and the measurement means measures the concentration or temperature of the processing liquid. The measurement means may include a first phosphoric acid concentration meter 564 measuring the phosphoric acid moisture concentration of moisture of the processing liquid and a thermometer (not shown) measuring the temperature of the processing liquid.

The first processing liquid recycling part 560 may include a first recycled processing liquid supply valve 566. The first recycled processing liquid supply valve 566 self-circulates the processing liquid through the first recycling circulation line 561 or discharges the recycled processing liquid to a recycled processing liquid supply tube 551. The first recycled processing liquid supply valve 566 may be a three way valve or a four way valve. The first recycled processing liquid supply valve 566 may selectively circulate the processing liquid to the first recycling circulation line 561 or discharge the recycled processing liquid to the recycled processing liquid supply tube 551.

In addition, the first recycling circulation line 561 may include a first sub filter 565 that self-circulates and filters the processing liquid.

The second processing liquid recycling part 580 may have a structure similar to the structure of the first processing liquid recycling part 560. The second processing liquid recycling part 580 may include a second recovery tank 590, a substance supply means 591, and an insert gas supply means 593. The substance supply means 591 supplies the processing liquid substance such as DIW, and the insert gas supply means 593 provides the pressure for discharging the processing liquid stored in the second recovery tank 590.

The second processing liquid recycling part 580 may include a second recycling circulation line 581 that self-circulates the processing liquid in the second recovery tank 590. The second recycling circulation line 581 may include a second recycling line pump 582, a second recycling line heater 583, and a second phosphoric acid the concentration meter 584 as a measurement means.

The first processing liquid recycling part 560 and the second processing liquid recycling part 580 may be arranged in parallel and be individually operated simultaneously or concurrently. The first processing liquid recycling part 560 and the second processing liquid recycling part 580 recycle the processing liquid in response to the recycling condition and selectively discharge the recycled processing liquid to the recycled processing liquid supply tube 551.

The recycled processing liquid supply tube 551 may have a flowmeter (not shown) so as to measure a supply amount and a flow rate of the recycled processing liquid.

The recycled processing liquid may be supplied from the processing liquid recycling parts 550 to the adjustment supply parts 410 through the recycled processing liquid supply tube 551. When the adjustment supply parts 410 includes the first adjustment supply part and the second adjustment supply part, the processing liquid recycling parts

550 may selectively supply the recycled processing liquid to the first adjustment supply part and the second adjustment supply part depending on a situation. In some embodiments, the processing liquid recycling parts 550 may supply the recycled processing liquid only to the first adjustment supply part.

Moreover, a sub recovery line 555 may be provided. The sub recovery line 555 recovers the processing liquid supplied from the processing liquid recycling parts 550 to the adjustment supply parts 410 through the recycled processing liquid supply tube 551. The recycled processing liquid supply tube 551 may include a recycled processing liquid supply valve 553 for controlling the supply of the recycled processing liquid to the adjustment supply parts 410, and include a recycled processing liquid recovered valve 557 for recovering the processing liquid to the sub recovery line 555. Each of the recycled processing liquid supply valve 553 and the recycled processing liquid recovered valve 557 may be replaced with a single three way valve The operation of the processing liquid recycling parts 550 is controlled by the control unit. The control unit controls the waste processing liquid to be selectively supplied from the recovery part 510 to at least one of the first processing liquid recycling part 560 and the second processing liquid recycling part 580, and the control unit controls a substance supply tube 571, 591 to selectively supply a substance such as DIW. The control unit recycles the processing liquid by self-circulating the processing liquid through the first recycling circulation line 561 and the second recycling circulation line 581 and by controlling the adjustment of the concentration and temperature of phosphoric acid moisture.

Preferable, the control unit controls any one of the first processing liquid recycling part 560 and the second processing liquid recycling part 580 to recycles the processing liquid, and controls a remaining one of the first and second processing liquid recycling parts to supply the recycled processing liquid to the adjustment supply parts 410 or to be supplied the waste processing liquid from the recovery part 510.

Furthermore, a processing liquid supply method of supplying a processing liquid through the processing liquid supply device according to the present disclosure will be proposed.

According to the present disclosure, the processing liquid supply method includes: supplying the processing liquid, wherein the processing liquid supplied to the adjustment supply part is self-circulated through the adjustment circulation line, concentration and temperature of the processing liquid are adjusted, and the processing liquid adjusted on the basis of the substrate processing condition is supplied to the main supply part; recovering the processing liquid, wherein the processing liquid recovered from the substrate processing apparatus to the recovery part is filtered and supplied to the processing liquid recycling part; and recycling the processing liquid, wherein the processing liquid supplied to the processing liquid recycling part is self-circulated through the recycling circulation line and is filtered and adjusted on the basis of the recycling condition, and the recycled processing liquid is supplied to the adjustment supply part.

The processing liquid supply method according to the present disclosure will be described with reference to the processing liquid supply device described above.

When new processing liquid is supplied, the silica supply means measures the supply amount of silica on the basis of the substrate processing condition and adjusts the concentration of silica to the required amount of silica at 5110. The required amount of silica and the processing liquid substance with phosphoric acid, DIW, etc. are supplied to the adjustment tank of the adjustment supply part on the basis of the substrate processing condition at 5130. The phosphoric acid solution may be supplied to the adjustment tank of the adjustment supply part by the mixing means as described above.

While the processing liquid stored in the adjustment tank of the adjustment supply part is self-circulated at 5150, the concentration of phosphoric acid and the temperature of the processing liquid are measured, and at least any one of phosphoric acid and DIW is supplied to the adjustment tank or the processing liquid is heated on the basis of the substrate processing condition, so that the concentration of phosphoric acid and the temperature of the processing liquid are adjusted at 5170.

When the processing liquid is adjusted suitable for the substrate processing condition, the adjustment supply part supplies the adjusted processing liquid to the main supply part. The main supply part supplies the adjusted processing liquid to the substrate processing apparatus at 5190. The main supply part may sample the processing liquid supplied to the substrate processing apparatus and measure the concentration of silica, and may inspect whether the proper amount of the processing liquid is supplied. However, when the processing liquid does not satisfy the proper amount thereof, silica may be supplied to the adjustment supply part or phosphoric acid or DIW may be supplied to the adjustment supply part. Alternately, the processing liquid may be further heated, and the processing liquid that does not reach a predetermined level is stopped from being supplied to the substrate processing apparatus and may be supplied. In addition, the processing liquid with the silica concentration close to the predetermined level may be used in the substrate processing apparatus and then discarded in the recovery part.

Then, the substrate processing apparatus performs the substrate treatment process with the supplied processing liquid at 5200.

The waste processing liquid discharged after the process of the substrate processing apparatus is performed is recovered by the recovery part at 5310 and is filtered. Then, the filtered processing liquid is supplied to the processing liquid recycling part at 5330.

The processing liquid recycling part stores the recovered processing liquid in the recovery tank and self-circulates the recovered processing liquid at 5410. The processing liquid recycling part measures the concentration of phosphoric acid moisture in the processing liquid and the temperature of the processing liquid. The processing liquid recycling part adjusts the concentration and the temperature of the processing liquid at 5430 to perform the recycling of the processing liquid.

The processing liquid recycling part supplies the recycled processing liquid to the adjustment supply part at 5450 to promote the recycling of the processing liquid. When the plurality of adjustment supply parts are provided, the processing liquid recycling part may supply the recycled processing liquid only to a preset adjustment supply part.

When the recycled processing liquid is supplied from the processing liquid recycling part, the adjustment supply part supplies the required amount of silica to the recycled processing liquid through the supplying the processing liquid at 5100 as described above. When necessary, the adjustment supply part supplies phosphoric acid or DIW while heating the processing liquid, thereby adjusting the concentration and temperature of the processing liquid in response to the substrate processing condition.

The substrate treatment process is performed by supplying the adjusted processing liquid to the substrate processing apparatus through the main supply part at 5200. While the processing liquid used in the substrate treatment process passes the recovering at 5300 and the recycling the processing liquid at 5400, the used processing liquid may be continuously recycled or may be discarded on the basis of the concentration of silica or the number of time the processing liquid is recycled.

The processing liquid supply method according to the present disclosure will be described with reference to a detailed operation of the processing liquid supply device according to the present disclosure.

In the processing liquid supply unit in the processing liquid supply device according to the present disclosure, the process of supplying the processing liquid substance will be described with reference to an embodiment of FIGS. 12 and 13.

Figure 12:
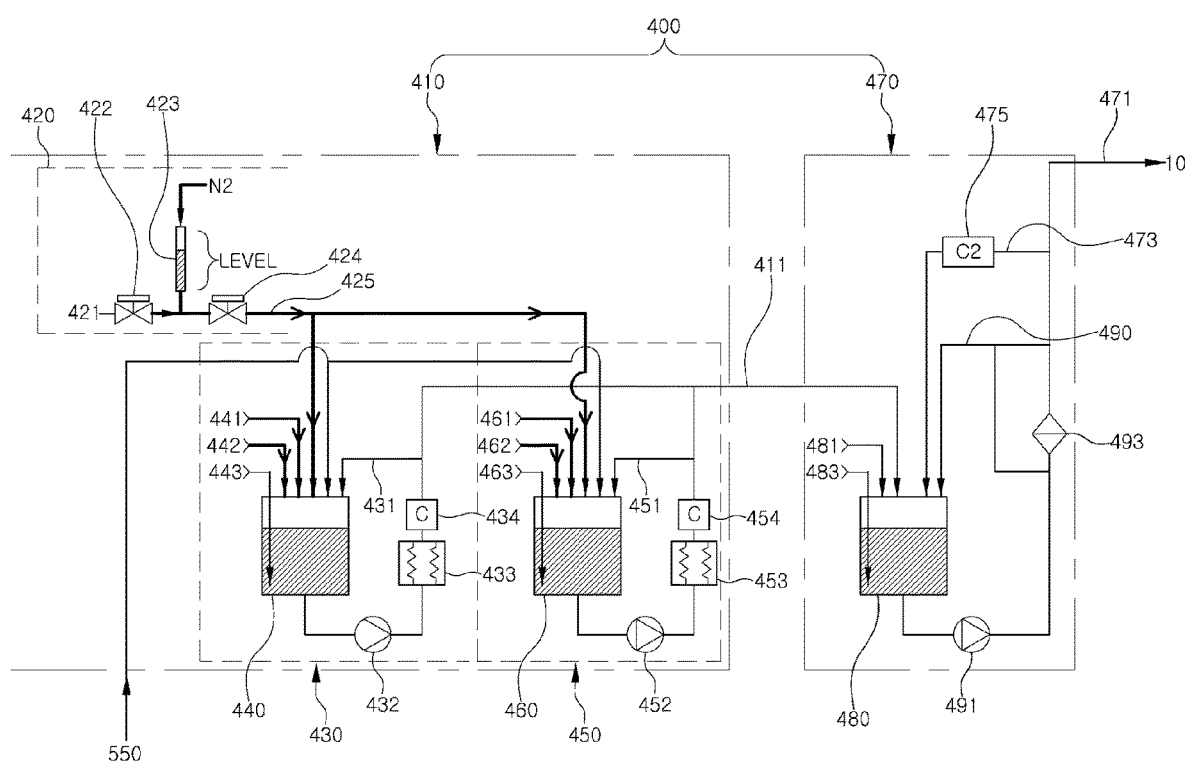
FIGS. 12 and 13 are block diagrams showing a process of supplying a processing liquid substance with respect to the processing liquid supply unit of the processing liquid supply device according to an embodiment of the present disclosure.

In FIG. 12, the processing liquid supply unit 400 directly supplies the processing liquid substance such as phosphoric acid and DIW to the adjustment tank.

According to the present disclosure, in order to properly adjust the concentration of silica containing in the processing liquid, the silica supply means 420 is provided. Therefore, the required amount of silica adjusted in response to the substrate processing condition may be supplied through the silica supply means 420.

The control unit measures the required amount of silica in response to the substrate processing condition through the silica measurement tube 423 of the silica supply means 420. The control unit may supply the required amount of silica to the first adjustment tank 440 of the first adjustment supply part 430 or the second adjustment tank 460 of the second adjustment supply part 450. The required amount of silica supplied may be preset in consideration of an etching selectivity ratio during selective etching of a silicon nitride film and a silicon oxide film using the phosphoric acid solution as the processing liquid.

In addition, the control unit controls the substance supply means 441, 442, 461, 462 to respectively supply phosphoric acid and DIW to the first adjustment tank 440 of the first adjustment supply part 430 and the second adjustment tank 460 of the second adjustment supply part 450. Accordingly, the processing liquid of the phosphoric acid solution containing silica may be selectively by the first adjustment tank 440 and the second adjustment tank 460 or the phosphoric acid concentration of the processing liquid may be adjusted. In some embodiments, phosphoric acid and DIW may be mixed together in proportion ranges of 15% and 25% to generate the phosphoric acid solution. When necessary, the proportion of phosphoric acid and DIW may be variously set.

Figure 13:
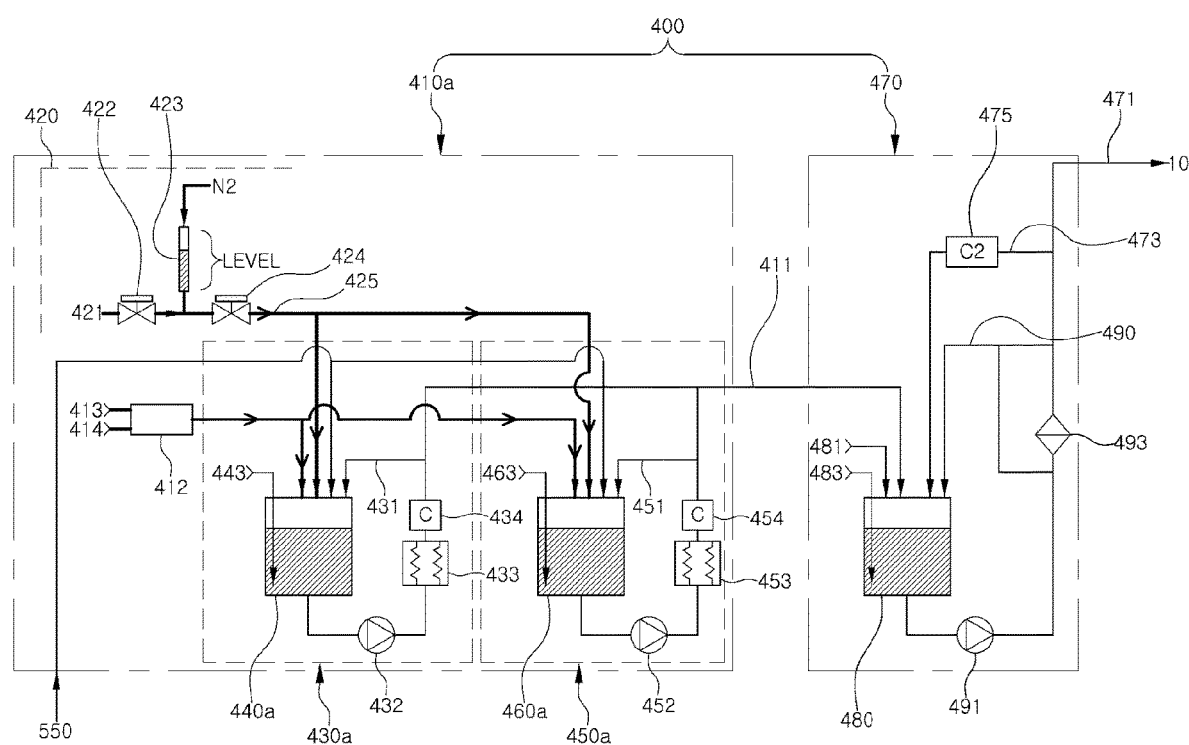

In an embodiment of FIG. 13 compared to the embodiment of FIG. 12, the processing liquid supply unit 400 mixes phosphoric acid and DIW together in the mixing means and supplies the phosphoric acid solution to the adjustment tank.

The supply and adjustment of silica by the silica supply means 420 is similar to the embodiment of FIG. 12, so a description thereof will be omitted.

As the mixer 412 is used as the mixing means, phosphoric acid and DIW are supplied to the mixer 412 arranged on the substance supply line so that the processing liquid of the phosphoric acid solution may be generated. The control unit controls the substance supply mean 413, 414 and the mixer 412 in response to the substrate processing condition, thereby generating the phosphoric acid solution in response to the substrate processing condition. The control unit controls the generated phosphoric acid solution to be selectively supplied to the first adjustment tank 440*a* of the first adjustment supply part 430*a* and the second adjustment tank 460*a* of the second adjustment supply part 450*a*.

As the first adjustment tank 440*a* and the second adjustment tank 460*a* are supplied with the phosphoric acid solution from the mixer 412, the first adjustment tank 440*a* and the second adjustment tank 460*a* may generate the processing liquid of the phosphoric acid solution containing silica or adjust the phosphoric acid concentration of the processing liquid.

By supplying the phosphoric acid solution as described above, the first adjustment supply part 430*a* and the second adjustment supply part 450*a* may easily adjust the concentration of phosphoric acid and reduce the adjustment time of the processing liquid.

Figure 14:
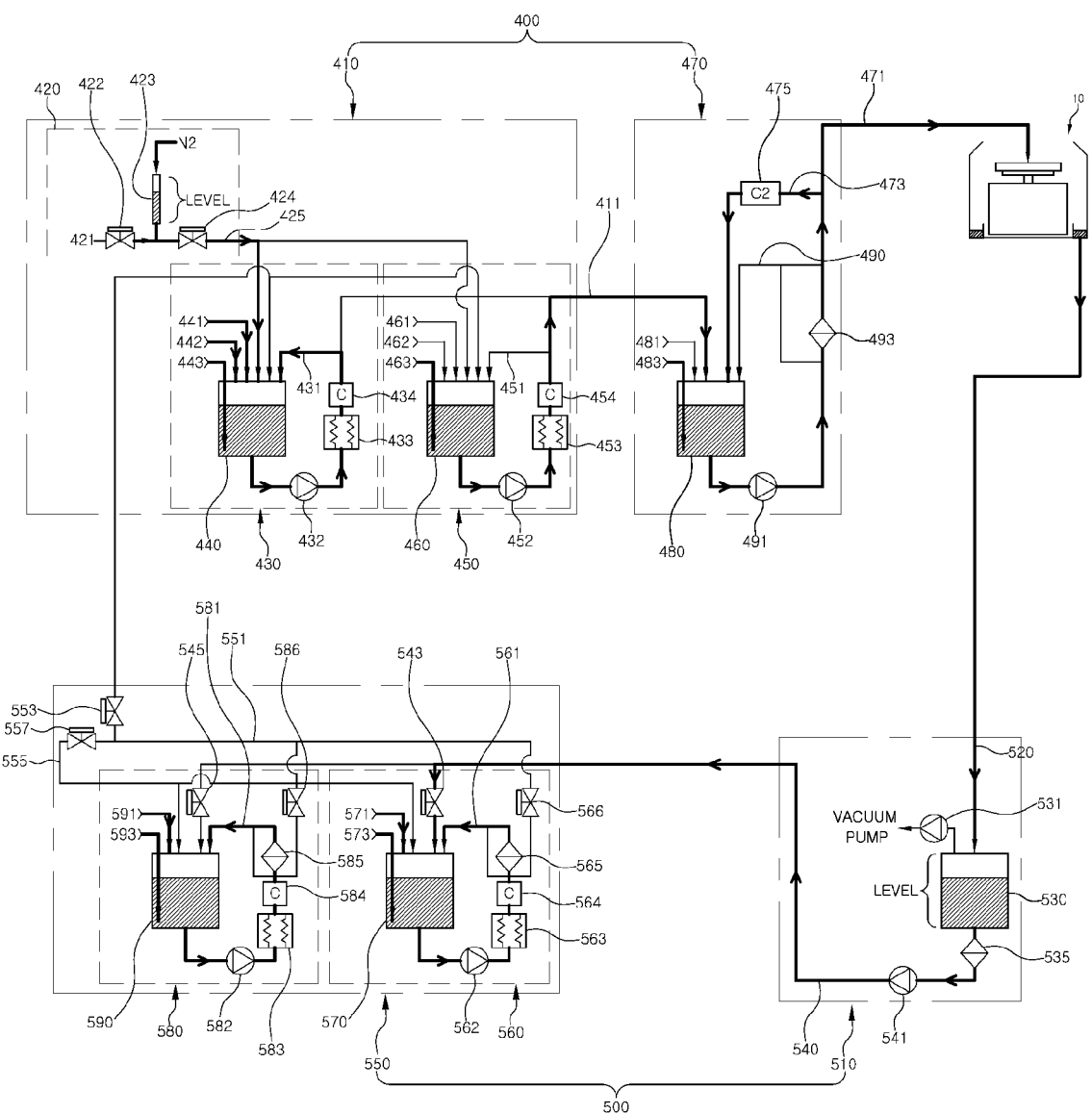
FIGS. 14 and 15 are block diagrams showing a processing liquid supply process through the processing liquid supply device according to an embodiment of the present disclosure.
Figure 15:
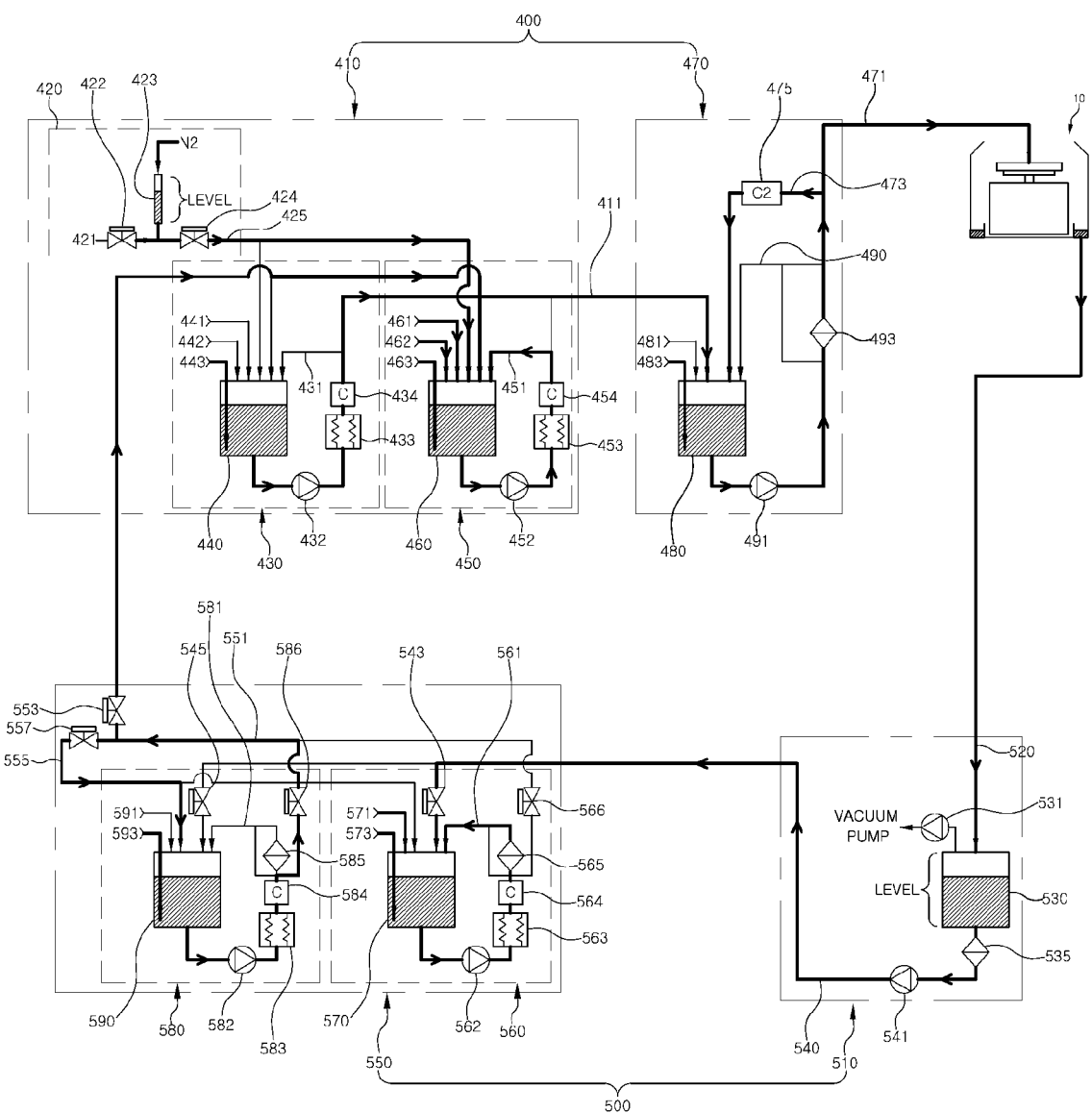

As shown in the embodiment in FIG. 12 or 13, the process in which the processing liquid substance is supplied and the concentration of the processing liquid substance and temperature of the processing liquid are adjusted in response to the substrate processing condition to supply the processing liquid to the substrate processing apparatus, and the used processing liquid is recovered and recycled will be described with reference to a process in which an embodiment of a supply process of the processing liquid performed by the processing liquid supply device according to the present disclosure, as shown in FIGS. 14 and 15.

FIG. 14 is a view showing a process of adjusting and supplying new processing liquid at the beginning on the basis of the substrate processing condition and of recovering and recycling the used processing liquid on the basis of the recycling condition.

The control unit measures the required amount of silica in response to the substrate processing condition by the silica measurement tube 423 of the silica supply means 420 and supplies the processing liquid to the first adjustment tank 440 to the first adjustment supply part 430. The control unit controls the substance supply means 441, 442 to supply phosphoric acid and DIW to the first adjustment tank 440 of the first adjustment supply part 430, and thus generates the processing liquid of phosphoric acid solution containing silica. The supply of phosphoric acid and DIW may be performed such that phosphoric acid solution is supplied to the first adjustment tank 440 by the mixing means.

The control unit self-circulates the processing liquid of the phosphoric acid solution to the first adjustment circulation line 431, and heats the processing liquid to adjust the processing liquid to the high-temperature phosphoric acid solution within a level from 170 to 180° C. Since the processing liquid is heated by being self-circulated to the first adjustment circulation line 431, DIW containing in the processing liquid may be evaporated. The concentration of phosphoric acid of the processing liquid is measured and DIW is additionally supplied when necessary.

While the second adjustment supply part 450 adjusts the processing liquid of the high-temperature phosphoric acid solution at the predetermined level in response to the substrate processing condition by performing the process of generating and adjusting the processing liquid, the control unit may control the adjusted processing liquid of phosphoric acid solution in the second adjustment supply part 450 to be supplied to the main supply tank 480 of the main supply part 470.

When the processing liquid of the predetermined level is supplied to the main supply tank 480 of the main supply part 470, the control unit controls each of the pumps and valves so as to supply the processing liquid in the main supply tank 480 to the substrate processing apparatus 10.

In some embodiments, while the processing liquid of phosphoric acid solution is supplied to the substrate processing apparatus 10, the processing liquid is sampled through the sampling line 473 to detect the concentration of silica. When the concentration of silica that is detected does not satisfy with the substrate processing condition, the control unit controls the silica supply means 420 to adjust the concentration of silica in the second adjustment tank 460 to adjust silica in the processing liquid supplied to the main supply tank 480. In addition, when the processing liquid supplied to the substrate processing apparatus 10 does not reach the predetermined level of the substrate processing condition, the control unit may stop the supply of the processing liquid and recover the processing liquid during the supply through the supply processing liquid recovery line 490.

The substrate processing apparatus 10 performs the substrate treatment process by the processing liquid of the high-temperature phosphoric acid solution containing silica supplied from the main supply part 470. The processing liquid of phosphoric acid solution used in the substrate processing apparatus 10 is recovered to the recovery tank 530 of the recovery part 510.

The control unit may store the processing liquid that is recovered to the predetermined level in the recovery tank 530, or may control the processing liquid recovered to the recovery tank 530 to be directly supplied to the processing liquid recycling parts 550.

The control unit controls the processing liquid in the recovery tank 530 to be supplied to any one of the first processing liquid recycling part 560 and the second processing liquid recycling part 580 in response to the operation of the first processing liquid recycling part 560 and the second processing liquid recycling part 580. for example, as shown in FIG. 14, when the second processing liquid recycling part 580 performs the recycling the processing liquid, the control unit may control the processing liquid in the recovery tank 530 to be supplied to the first recovery tank 570 of the first processing liquid recycling part 560.

When the recovered processing liquid is supplied from the recovery part 510 to the processing liquid recycling parts 550, the recovered processing liquid is supplied such that the main filter 535 filters foreign substances from the recovered processing liquid while improving the filtering efficiency of the main filter in response to the supply amount of the processing liquid. The processing liquid discharged from the recovery tank 530 is distributed to the plurality of branch tubes (not shown) and the main filter arranged on each of the branch tubes may filter the distributed processing liquid.

The control unit may store the processing liquid to the predetermined level when the processing liquid is supplied to the first recovery tank 570 of the first processing liquid recycling part 56, or the control unit may control the first recovery tank 570 to be supplied with the recovered processing liquid and to self-circulate the processing liquid through the first recycling circulation line 561 to perform the recycling process.

When the first processing liquid recycling part 560 is supplied with the processing liquid recovered from the recovery tank 530, the control unit may control the recycling process of the processing liquid stored in the second recovery tank 590 of the second processing liquid recycling part 580 to be performed.

Therefore, the control unit may control the processing liquid stored in the second recovery tank 590 of the second processing liquid recycling part 580 to be self-circulated through the second recycling circulation line 581 and being heated and filtered. The control unit measures the concentration of phosphoric acid moisture with respect to the processing liquid of the phosphoric acid solution circulating the second recycling circulation line 581, and on the basis of a measuring result, the control unit controls the second recovery tank 590 to be supplied with DIW or to heat the processing liquid of the second recycling circulation line 581. For example, the control unit may control phosphoric acid and DIW are contained in the processing liquid circulated in the second recycling circulation line 581, at a proportion of 50%. In some embodiments, the control unit may adjust phosphoric acid and DIW to be contained with proportions of 85% and 15%. The proportion of phosphoric acid and DIW contained in the processing liquid may be properly changed.

By passing the above process, the supplying process of the processing liquid of new phosphoric acid solution and the recycling process of the used processing liquid of phosphoric acid solution may be achieved.

FIG. 15 is a view showing a process of adjusting and supplying recycled processing liquid on the basis of the substrate processing condition and of recovering and recycling the used processing liquid on the basis of the recycling condition.

While the recovered processing liquid is recycled in the second processing liquid recycling part 580 in response to the recycling condition, the control unit may control the recycled processing liquid recycled in the second recovery tank 590 of the second processing liquid recycling part 580 to be supplied to the adjustment supply parts 410.

The control unit may control the recycled processing liquid to be supplied to any one of the first adjustment supply part 430 and the second adjustment supply part 450 in consideration of the operation of the first adjustment supply part 430 and the second adjustment supply part 450. For example, as shown in FIG. 15, when the first adjustment supply part 430 supplies the adjusted processing liquid to the main supply part 470, the control unit may control the second processing liquid recycling part 580 to supply the recycled processing liquid to the second adjustment tank 460 of the second adjustment supply part 450.

In some embodiments, the flowmeter (not shown) arranged in the recycled processing liquid supply tube 551 may measure the processing liquid supplied to the second adjustment tank 460. When the processing liquid is stored into the second adjustment tank 460 above the predetermined level, the control unit may control the processing liquid supplied to the second adjustment tank 460 through the sub recovery line 555 to be recovered to the processing liquid recycling parts 550.

The second adjustment supply part 450 is supplied with the recycled processing liquid from the second processing liquid recycling part 580, and adjusts the processing liquid in response to the substrate processing condition. Therefore, the control unit heats the processing liquid of phosphoric acid solution stored in the second adjustment tank 460 while self-circulating the processing liquid through the second adjustment circulation line 451, and measures the concentration of phosphoric acid. According to a measuring result, the control unit may control phosphoric acid or DIW to be supplied to the second adjustment tank 460.

During the recycling process in the second adjustment supply part 450 supplied with the recycled processing liquid, the first adjustment supply part 430 supplies the adjusted processing liquid to the main supply part 470 in response to the substrate processing condition and the main supply part 470 supplies the adjusted processing liquid to the substrate processing apparatus 10.

The processing liquid used in the substrate processing apparatus 10 is recovered again to the recovery tank 530 of the recovery part 510. The processing liquid is filtered in the recovery part 510 and then is supplied to the processing liquid recycling parts 550.

Figure 16:
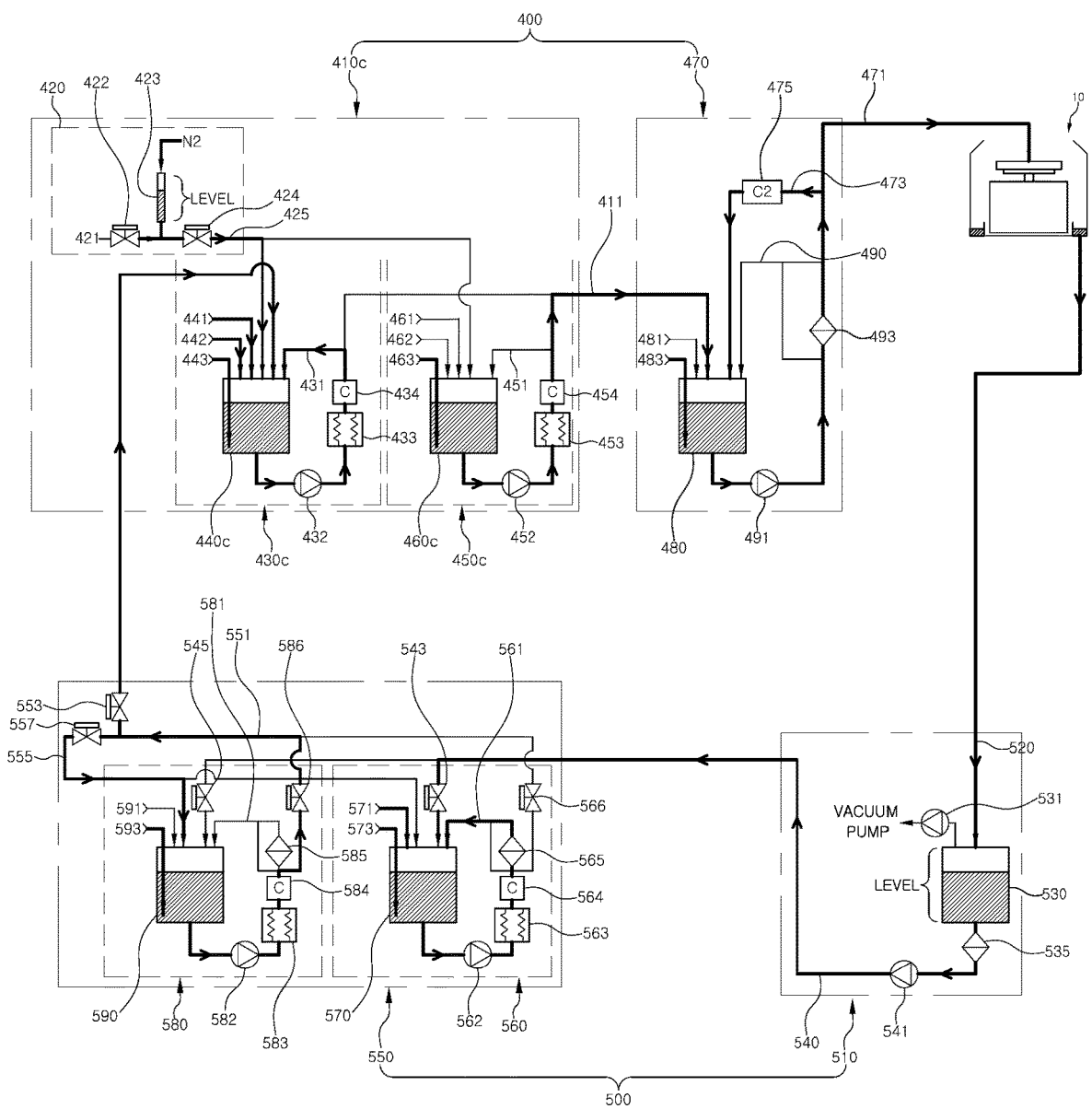
FIGS. 16 and 17 are block diagrams showing the processing liquid supply process through the processing liquid supply device according to an embodiment of the present disclosure.
Figure 17:
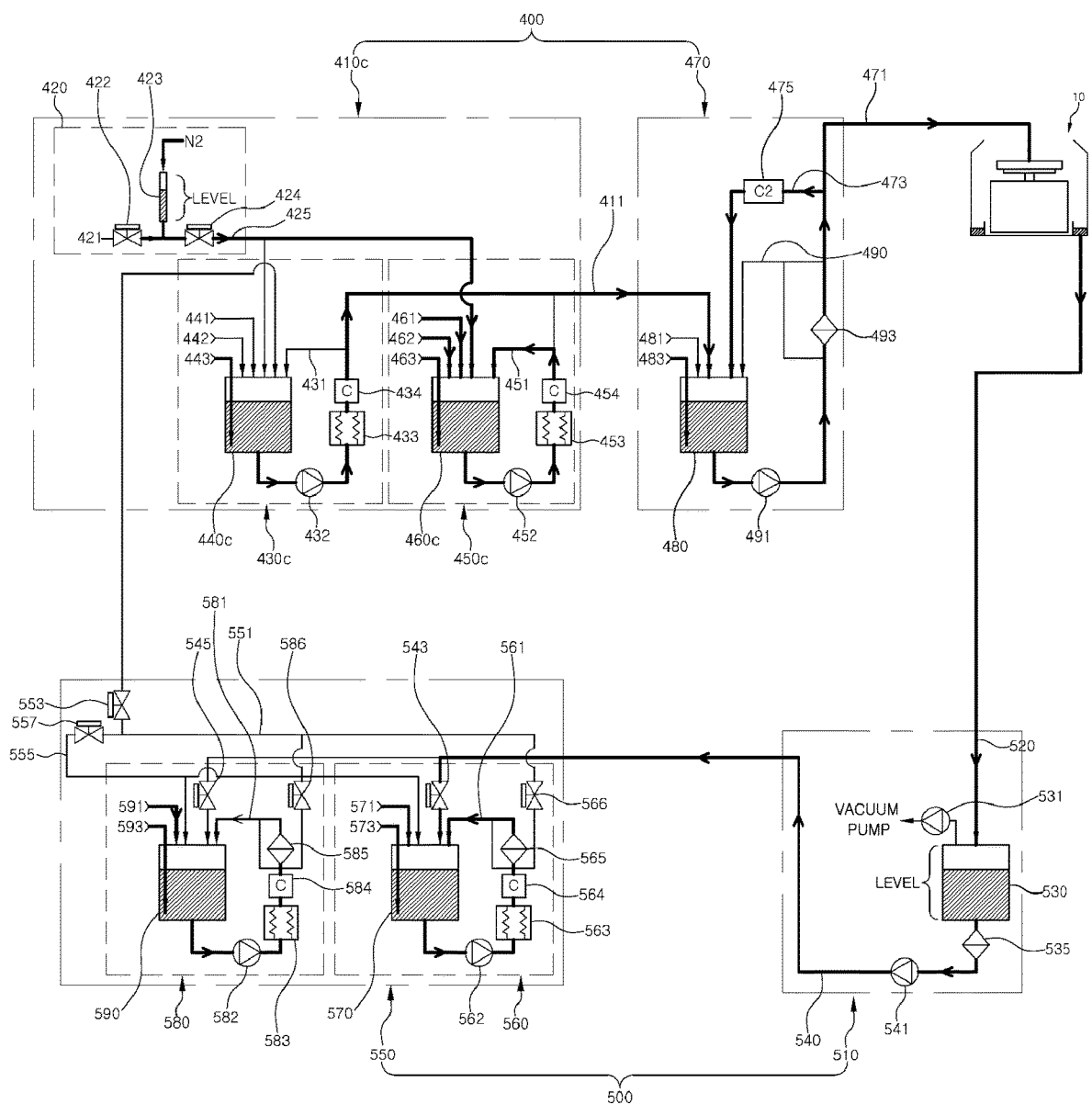

FIGS. 16 and 17 are views showing other embodiments of the supplying process through the processing liquid supply device according to the present disclosure. The embodiments show the supplying process of the processing liquid in the embodiment of the processing liquid supply unit 400 as shown in FIG. 9.

In describing the embodiments of FIGS. 16 and 17, a description overlapping with the embodiments of FIGS. 14 and 15 described above will be omitted.

In the embodiments of FIGS. 16 and 17, the first adjustment supply part 430c is supplied with the recycled processing liquid from the processing liquid recycling parts 550 and adjusts and supplies the recycled processing liquid in response to the substrate processing condition. The second adjustment supply part 450c is supplied with new processing liquid substance, and generates new processing liquid, and adjusts and supplies the new processing liquid in response to the substrate processing condition.

In the embodiment of FIG. 16, the second adjustment supply part 450c generates and adjusts new processing liquid substance to supply new processing liquid substance to the main supply part 470. The second adjustment supply part 450c supplies the processing liquid from the main supply part 470 to the substrate processing apparatus 10.

While the second adjustment supply part 450c supplies new processing liquid, the control unit controls the first adjustment supply part 430c to be supplied with the recycled processing liquid from the second processing liquid recycling part 580 and to self-circulate the processing liquid of phosphoric acid solution through the first adjustment circulation line 431, and to measure the concentration of phosphoric acid and to heat the processing liquid. In addition, the control unit supplies phosphoric acid or DIW to the first adjustment tank 440c to adjust the concentration of phosphoric acid and the temperature of the processing liquid of the phosphoric acid solution.

The processing liquid used in the substrate processing apparatus 10 is recovered to the recovery tank 530 of the recovery part 510. The control unit controls the recovered processing liquid to be supplied to the first processing liquid recycling part 560 to achieve the recycling process of the recovered processing liquid.

While the first adjustment supply part 450c is supplied with the recycled processing liquid and adjusts the processing liquid in response to the substrate processing condition as described in the embodiment of FIG. 16, the control unit controls the first adjustment supply part 453c to supply the adjusted processing liquid to the main supply part 470 as described in the embodiment of FIG. 17. Therefore, the processing liquid supplied from the first adjustment supply part 430c is supplied from the main supply part 470 to the substrate processing apparatus 10.

In addition, while the first adjustment supply part 430c supplies the adjusted processing liquid to the main supply part 470, the control unit controls a new processing liquid substance to be supplied to the second adjustment supply part 450c and the adjustment of the processing liquid to be performed.

While the first adjustment supply part 430c supplies the adjusted processing liquid to the main supply part 470, the control unit controls the first processing liquid recycling part 560 to be supplied with the processing liquid recovered to the recovery tank 530 of the recovery part 510, controls the second processing liquid recycling part 580 to self-circulate the processing liquid through the second recycling circulation line 581 and to perform the recycling of the processing liquid.

However, even when the first processing liquid recycling part 560 supplies the recycled processing liquid, the recycled processing liquid is supplied to the first adjustment supply part 430c.

Moreover, the first adjustment supply part 430c adjusts the recycled processing liquid supplied from the processing liquid recycling parts 550 and supply the adjusted processing liquid to the second adjustment supply part 450c. Therefore, the recycled processing liquid and the new processing liquid are mixed together, and the mixture may be supplied to the substrate processing apparatus 10.

Figure 18:
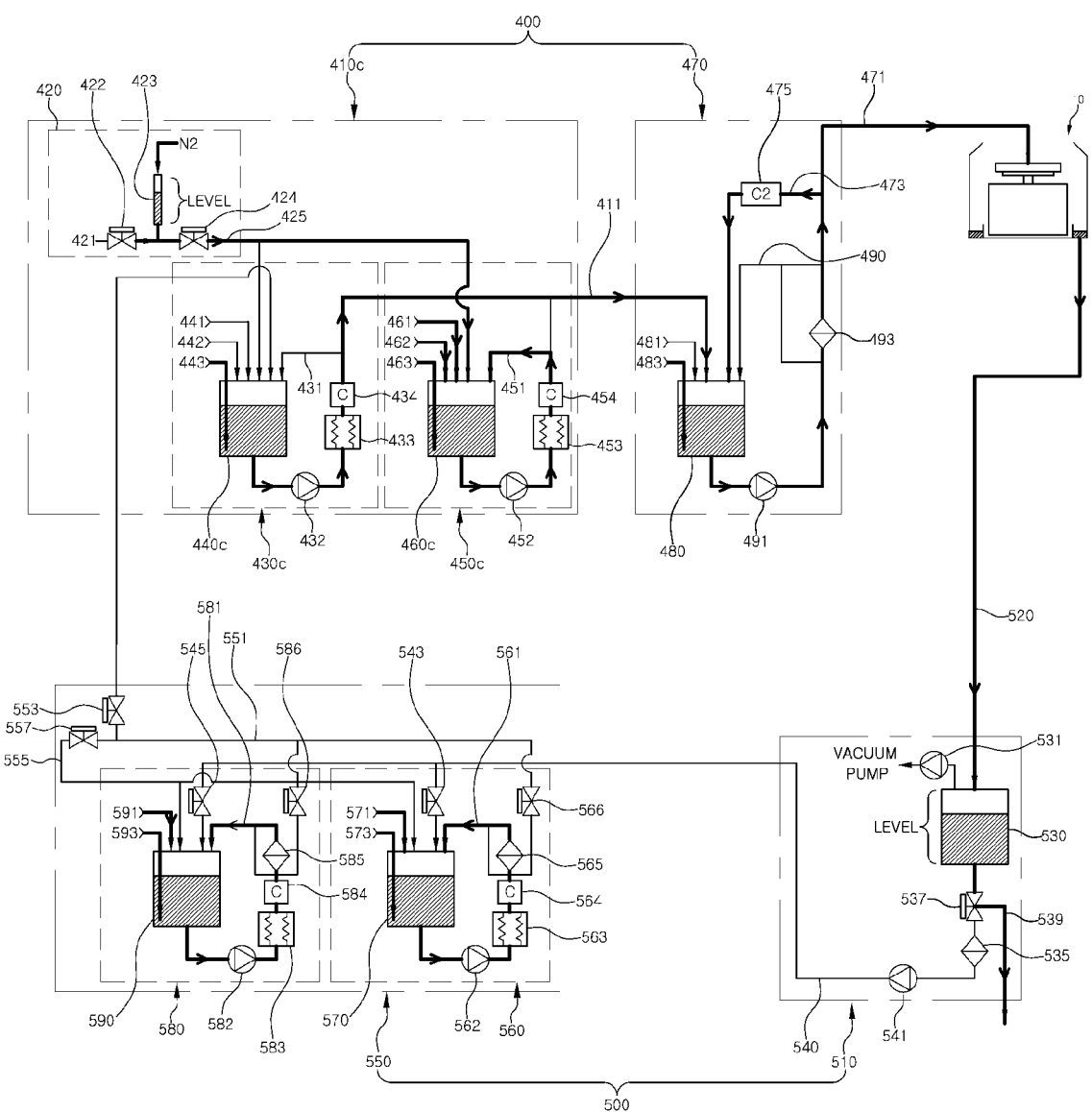
FIG. 18 is a view showing a processing liquid disposal process through the processing liquid supply device according to an embodiment of the present disclosure.

In the present disclosure, when recovering and recycling and supplying of the processing liquid are repeated, the recovered processing liquid may be discarded in response to the number of time the processing liquid is recycled or the concentration of silica. In FIG. 18, a disposal process of the processing liquid through the embodiment of the processing liquid supply device according to the present disclosure will be shown.

The first adjustment supply part 430c is supplied with the recycled processing liquid from the processing liquid recycling parts 550, and adjusts the processing liquid in response to the substrate processing condition, and then supplies the adjusted processing liquid to the main supply part 470. When the main supply part 470 supplies the processing liquid supplied from the first adjustment supply part 430c to the substrate processing apparatus 10, the control unit controls the processing liquid supplied from the first adjustment supply part 453c to be used in the substrate processing apparatus 10, to be recovered to the recovery tank 530 of the recovery part 510 and be discharged to the waste processing liquid discharge tube 539 through the drain valve 537, when the number of time the same recycled processing liquid is repeatedly adjusted and supplied reaches to the preset value. Accordingly, the disposal of the processing liquid may be performed.

The first adjustment supply part 453c may include a counter (not shown) that counts the number of time the recycled processing liquid is supplied from the processing liquid recycling parts 550 or of supplying the processing liquid to the main supply part 470. The control unit may determine whether the disposal of the processing liquid is performed or not on the basis of the counter of the first adjustment supply part 430c. After the disposal of the processing liquid, when new processing liquid is recycled, the control unit may reset the counting to start new counting.

In addition to determining the disposal on the basis of the recycling number of the processing liquid, the control unit may control whether the disposal is performed or not on the basis of the concentration of silica contained in the recycled processing liquid. When the main supply part 470 supplies the processing liquid supplied from the first adjustment supply part 430c to the substrate processing apparatus 10, the concentration of silica is measured by the sampling of the processing liquid through the sampling line 473, and when the processing liquid supplied to the substrate processing apparatus 10 has the concentration of silica exceeding the preset limitation, the control unit controls the processing liquid to be used in the substrate processing apparatus 10, to be recovered to the recovery tank 530 of the recovery part 510, and then to discharge the processing liquid to the waste processing liquid discharge tube 539 through the drain valve 537. Accordingly, the disposal of the processing liquid may be achieved.

As described above, the present disclosure includes the plurality of adjustment supply parts, so that any one of the adjustment supply parts may adjust the concentration and temperature of the processing liquid in response to the substrate processing condition, and a remaining one of the adjustment supply parts may supply the adjusted processing liquid to the main supply part or be supplied with the recycled processing liquid from the processing liquid recycling part. Accordingly, the processing liquid may be continuously supplied to the substrate processing apparatus.

In addition, the present disclosure includes the plurality of processing liquid recycling parts, so that any one of the processing liquid recycling parts may selectively adjust the concentration and temperature of the processing liquid on the basis of the processing liquid the recycling condition and a remaining one of the processing liquid recycling parts may be supplied with the processing liquid from the recovery part or supply the recycled processing liquid to the adjustment supply part. Therefore, the processing liquid may be continuously recycled.

Although the preferred embodiments of the present disclosure have been disclosed for illustrative purposes, those skilled in the art will appreciate that various modifications, additions and substitutions are possible, without departing from the scope and spirit of the invention as disclosed in the accompanying claims. Since the present disclosure may be embodied in other specific forms without changing the technical sprit or essential features, those skilled in the art to which the present disclosure belongs should understand that the embodiments described above are exemplary and not intended to limit the present disclosure. The scope of the present disclosure will be defined by the accompanying claims rather than by the detailed description, and those skilled in the art should understand that various modifications, additions and substitutions derived from the meaning and scope of the present disclosure and the equivalent concept thereof are included in the scope of the present disclosure.

What is claimed is:

1. A processing liquid supply device comprising:
a processing liquid supply unit comprising:
 a main supply part configured to supply processing liquid to a substrate processing apparatus, and
 an adjustment supply part configured to:
  adjust a temperature of the processing liquid in response to a substrate processing condition to generate a first adjusted processing liquid of the processing liquid supplied from the main supply part, and
  supply the first adjusted processing liquid to the main supply part;
a processing liquid recycling unit comprising:
 a recovery part configured to recover the processing liquid from the substrate processing apparatus to generate a recovered processing liquid, and
 a processing liquid recycling part configured to:
  receive the recovered processing liquid from the recovery part, and
  adjust the temperature of the recovered processing liquid in response to a recycling condition to generate a second adjusted processing liquid of the recovered processing liquid received from the recovery part;
  supply the second adjusted processing liquid to the adjustment supply part; and
a control unit connected to the processing liquid supply unit and the processing liquid recycling unit and configured to control the processing liquid supply unit and the processing liquid recycling unit for the supply of the processing liquid to the substrate processing apparatus, the adjustment of the processing liquid in response to the substrate processing condition, the adjustment of the recovered processing liquid in response to the recycling condition, the recovery of the processing liquid from the substrate processing apparatus, or the recovery of the processing liquid from the substrate processing apparatus,
wherein the main supply part comprises:
a main supply tank configured to supply the processing liquid to the substrate processing apparatus;
a processing liquid supply tube connected to the main supply tank and the substrate processing apparatus;
a sampling line connected to the processing liquid supply tube and configured to sample a sampled processing liquid from the processing liquid flowing through the processing liquid supply tube connected to the main supply tank; and
a silica concentration meter connected to the sampling line and the main supply tank and configured to measure a concentration of silica contained in the sampled processing liquid and return the sampled processing liquid to the main supply tank.

2. The processing liquid supply device of claim 1,
wherein the processing liquid supply unit further comprises a silica supplier configured to:
measure a supply amount of silica, and
supply silica in response to the substrate processing condition,
wherein the adjustment supply part comprises:
an adjustment tank configured to:
adjust the processing liquid containing silica, and
supply the first adjusted processing liquid to the main supply part; and
an adjustment circulation line configured to:
circulate the processing liquid in the adjustment tank,
measure a concentration of the processing liquid, and
adjust a temperature of the processing liquid, and
wherein the control unit is configured to:
control supplying or heating phosphoric acid and deionized water (DIW) in response to a measuring result of a concentration of the phosphoric acid in the processing liquid in the adjustment circulation line to adjust the concentration of the phosphoric acid.

3. The processing liquid supply device of claim 2,
wherein the processing liquid supply unit further comprises:
a mixer connected to the adjustment tank and configured to:
mix the phosphoric acid and the DIW to form a phosphoric acid solution, and
supply the phosphoric acid solution to the adjustment tank in response to the substrate processing condition, and
wherein the control unit is configured to adjust the concentration of the phosphoric acid by supplying the phosphoric acid solution through the mixer in response to the measuring result of the concentration of the phosphoric acid in the processing liquid in the adjustment circulation line.

4. The processing liquid supply device of claim 2 or claim 3,
wherein the adjustment supply part comprises:
a first adjustment supply part and a second adjustment supply part, and
wherein the first adjustment supply part and the second adjustment supply part are configured to supply the first adjusted processing liquid to the main supply part.

5. The processing liquid supply device of claim 4,
wherein the control unit is configured to:
control one of the first adjustment supply part and the second adjustment supply part to adjust the processing liquid, and
control a remaining one of the first adjustment supply part and the second adjustment supply part to supply the first adjusted processing liquid to the main supply part or to receive the second adjusted processing liquid from the processing liquid recycling part.

6. The processing liquid supply device of claim 4,
wherein the control unit is configured to:
control the first adjustment supply part to receive the second adjusted processing liquid as a recycled processing liquid from the processing liquid recycling part, and
control the second adjustment supply part to receive a new processing liquid substance.

7. The processing liquid supply device of claim 2,
wherein the control unit is configured to:
control supplying of silica in the adjustment supply part in response to a measuring result of a concentration of silica in the sampled processing liquid to adjust the concentration of silica, or
drain the processing liquid recovered by the recovery part to an outside of the recovery part and dispose the processing liquid.

8. The processing liquid supply device of claim 1,
wherein the processing liquid recycling part comprises:
a recovery tank configured to:
adjust a concentration of moisture of the recovered processing liquid supplied from the recovery part to generate the second adjusted processing liquid, and
supply the second adjusted processing liquid to the processing liquid supply unit; and
a recycling circulation line configured to:
circulate and filter the recovered processing liquid in the recovery tank, and
measure a concentration of the recovered processing liquid and adjust the temperature of the processing liquid to generate the second adjusted processing liquid, and
wherein the control unit is configured to control supplying or heating DIW to adjust the concentration of moisture in response to a measuring result of the concentration of moisture in the recovered processing liquid in the recycling circulation line.

9. The processing liquid supply device of claim 8,
wherein the recovery part comprises:
a recovery tank configured to recover the processing liquid from the substrate processing apparatus;
a plurality of branch tubes arranged between an outlet tube of the recovery tank and an inlet tube of the processing liquid recycling part; and
a main filter arranged in each branch tube of the plurality of branch tubes and configured to filter the recovered processing liquid.

10. The processing liquid supply device of claim 7,
wherein the recovery part comprises:
a recovery tank configured to recover the processing liquid from the substrate processing apparatus; and
a drain valve configured to drain the processing liquid in the recovery tank to an outside of the drain valve, and
wherein the control unit is configured to control the recovered processing liquid to be drained to the outside of the recovery part and to be discarded on the basis of at least one of a measuring result of the concentration of silica in the processing liquid supplied to the substrate processing apparatus and a number of times the processing liquid was recovered.

11. The processing liquid supply device of claim 4,
wherein the processing liquid recycling part comprises a first processing liquid recycling part and a second processing liquid recycling part, and
wherein the first processing liquid recycling part and the second processing liquid recycling part are configured to:
receive the recovered processing liquid from the recovery part, and
supply the second adjusted processing liquid to the adjustment supply part.

12. The processing liquid supply device of claim 11,
wherein the control unit is configured to:
control one of the first processing liquid recycling part and the second processing liquid recycling part to recycle the processing liquid; and
control a remaining one of the first processing liquid recycling part and the second processing liquid recycling part to receive the recovered processing liquid from the recovery part or to supply the second adjusted processing liquid as a recycled processing liquid to the adjustment supply part.

13. The processing liquid supply device of claim 1,
wherein the processing liquid supply unit is arranged in a space coincident with the substrate processing apparatus, and
wherein the processing liquid recycling unit is arranged in a separate space from the processing liquid supply unit.

14. A processing liquid supply device comprises:
a processing liquid supply unit including an adjustment supply part and a main part,
wherein the adjustment supply part includes a first adjustment supply part supplied with a recycled processing liquid and a second adjustment supply part supplied with a new processing liquid,
wherein the adjustment supply part is configured to:
self-circulate a processing liquid,
measure a supply amount of silica by a silica concentration meter and selectively supply the silica,
selectively supply phosphoric acid solution in which phosphoric acid and DIW are mixed by a mixing means,
heat the processing liquid through an adjustment circulation line to generate an adjusted processing liquid by adjusting a temperature of the processing liquid in response to substrate processing condition, and
supply the adjusted processing liquid to a main supply part,
wherein the main supply part includes the silica concentration meter,
wherein the main supply part further includes:

a main supply tank supplying the processing liquid to a substrate processing apparatus, a processing liquid supply tube connected to the main supply tank and the substrate processing apparatus, and a sampling line connected to the processing liquid supply tube and configured to sample a sampled processing liquid from the processing liquid supplied to the substrate processing apparatus, and wherein the silica concentration meter is connected to the sampling line and the main supply tank and configured to measure a concentration of silica contained in the sampled processing liquid and return the sampled processing liquid to the main supply tank;

a processing liquid recycling unit including a recovery part and a plurality of processing liquid recycling parts, wherein the recovery part is configured to recover the processing liquid from the substrate processing apparatus and filter the processing liquid by main filters arranged on a plurality of branch tubes to supply a recovered processing liquid to the plurality of processing liquid recycling parts, and wherein the plurality of processing liquid recycling parts are configured to:

receive DIW while self-circulating the recovered processing liquid, or recycle the recovered processing liquid in response to a recycling condition by heating the processing liquid and supply the recovered processing liquid as the recycled processing liquid to the first adjustment supply part; and a control unit configured to:

control one of the first adjustment supply part and the second adjustment supply part to adjust the processing liquid, control a remaining one of the first adjustment supply part and the second adjustment supply parts to supply the processing liquid to the main supply part, control one of the plurality of processing liquid recycling parts to recycle the processing liquid, and control a remaining one of the plurality of processing liquid recycling parts to be supplied with the processing liquid from the recovery part or to supply the recycled processing liquid to the first adjustment supply part, wherein the processing liquid supply unit and the processing liquid recycling unit are arranged to be spatially separated from each other.

15. The processing liquid supply device of claim 1, further comprising:

a supply processing liquid recovery line connected to the processing liquid supply tube and the main supply tank and configured to return, in response to the concentration of the silica measured by the silica concentration meter, the processing liquid of the processing liquid supply tube to the main supply tank.

* * * * *